(12) United States Patent
Ng et al.

(10) Patent No.: US 10,084,630 B2
(45) Date of Patent: Sep. 25, 2018

(54) MULTI-BEAM CREST FACTOR REDUCTION

(71) Applicant: Blue Danube Systems, Inc., Warren, NJ (US)

(72) Inventors: Chris Tsun Kit Ng, Somerset, NJ (US); Ramesh Chembil-Palat, Millbrae, CA (US)

(73) Assignee: Blue Danube Systems, Inc., Warren, NJ (US)

( * ) Notice: Subject to any disclaimer, the term of this patent is extended or adjusted under 35 U.S.C. 154(b) by 0 days.

(21) Appl. No.: 15/387,774

(22) Filed: Dec. 22, 2016

(65) Prior Publication Data
US 2017/0187560 A1 Jun. 29, 2017

Related U.S. Application Data

(60) Provisional application No. 62/272,269, filed on Dec. 29, 2015.

(51) Int. Cl.
| | |
|---|---|
| *H04L 27/26* | (2006.01) |
| *H03F 1/32* | (2006.01) |
| *H04B 1/04* | (2006.01) |
| *H04B 7/06* | (2006.01) |

(52) U.S. Cl.
CPC ....... *H04L 27/2623* (2013.01); *H03F 1/3282* (2013.01); *H04B 1/04* (2013.01); *H04B 7/0615* (2013.01); *H04B 2001/0408* (2013.01)

(58) Field of Classification Search
USPC .................................................. 375/297, 296
See application file for complete search history.

(56) References Cited

U.S. PATENT DOCUMENTS

| | | | | |
|---|---|---|---|---|
| 9,485,129 | B1 * | 11/2016 | Cope | H04L 27/2623 |
| 9,628,120 | B2 * | 4/2017 | Yu | H04B 1/0475 |
| 2006/0029158 | A1 | 2/2006 | Lipka et al. | |
| 2006/0040624 | A1 | 2/2006 | Lipka | |
| 2006/0171486 | A1 * | 8/2006 | Tan | H04L 27/2624 |
| | | | | 375/296 |
| 2012/0093209 | A1 | 4/2012 | Schmidt et al. | |
| 2014/0254718 | A1 * | 9/2014 | Hori | H04B 1/0475 |
| | | | | 375/296 |
| 2014/0362951 | A1 * | 12/2014 | Fehri | H04L 27/2623 |
| | | | | 375/297 |

(Continued)

*Primary Examiner* — Eva Puente
(74) *Attorney, Agent, or Firm* — Occhiuti & Rohlicek LLP

(57) ABSTRACT

A system for use with beam signals, the system including: a crest factor reduction (CFR) module having inputs and corresponding outputs, wherein each of the inputs is for receiving a corresponding different beam signal of the beam signals and wherein each output corresponds to a different input of the plurality of inputs and is for outputting a different CFR-adjusted signal of a plurality of CFR-adjusted signals, each CFR-adjusted signal of the plurality of CFR-adjusted signals corresponding to a different beam signal of the plurality of beam signals; and a transmitter connected to the outputs of the CFR module, wherein the CFR module is configured to perform crest factor reduction on the beam signals to generate the plurality of CFR-adjusted signals, and wherein the crest factor reduction performed on the beam signals is based on a weighted sum of the magnitudes of multiple beams signals among the beam signals.

21 Claims, 20 Drawing Sheets

(56) References Cited

U.S. PATENT DOCUMENTS

| | | | |
|---|---|---|---|
| 2015/0022269 A1* | 1/2015 | Huang | H04L 27/2623 330/291 |
| 2015/0244414 A1* | 8/2015 | Yu | H04B 1/525 455/73 |
| 2016/0227549 A1* | 8/2016 | Shako | H04W 52/0261 |

* cited by examiner

|  | ACLR (dBc) | Individual PAPR (dB) | Combined PAPR (dB) | EVM (%) | LTE EVM Limit (%) |
|---|---|---|---|---|---|
| E-TM3.1 (64QAM) | 73.8 ± 0.8 | 7.94 ± 0.02 | 7.96 ± 0.01 | 4.18 ± 0.08 | 9 |
| E-TM3.2 (16QAM) | 73.8 ± 0.8 | 7.94 ± 0.02 | 7.93 ± 0.01 | 5.88 ± 0.09 | 13.5 |
| E-TM3.3 (QPSK) | 73.9 ± 0.8 | 7.94 ± 0.02 | 7.95 ± 0.02 | 8.23 ± 0.14 | 18.5 |

FIG. 17

MULTI-BEAM CREST FACTOR REDUCTION

This application claims the benefit under 35 U.S.C. 119(e) of Provisional Application Ser. No. 62/272,269, filed Dec. 29, 2015, entitled "Multi-Beam Crest Factor Reduction," the entire contents of which are incorporated herein by reference.

FIELD OF THE INVENTION

The present disclosure relates generally to wireless systems such as cellular or wireless local area networks and, more particularly to multi-beam phased array systems.

BACKGROUND

Phased arrays create beamed radiation patterns in free space to allow the formation of selective communication channels. A phased array is formed by placing a plurality of antennas in a grid pattern on a planar surface where these antennas are typically spaced ½ of the wavelength of the radio frequency (RF) signal from one another. The phased array can generate radiation patterns in preferred directions by adjusting the phase and amplitude of the RF signals being applied to each of the antennas. The emitted wireless RF signals can be reinforced in particular directions and suppressed in other directions due to these adjustments. The wireless beam is steered electronically to send a communication channel, thereby eliminating the need to adjust the position or direction of the antennas mechanically.

A phased array requires the orchestration of the plurality of antennas forming the array to perform in unison. A corporate feed network provides the timing to the phased array by delivering identical copies of an RF signal to each of the plurality of antennas forming the phased array. A uniform placement of the plurality of antennas over a planar area defines the phased array as having a surface area that extends over several wavelengths of the carrier frequency of the RF signal in both of the X and Y directions. For example, a phased array with 100 antennas arranged in a square planar area would have edge dimension equal to 5 wavelengths of the RF carrier frequency in each direction.

In cellular transmission, orthogonal frequency-division multiplexing (OFDM) is adopted by modern systems such as Long-Term Evolution (LTE) due to its resistance to intersymbol interference (ISI) and low-complexity in channel equalization. However, OFDM signals typically exhibit a high peak-to-average power ratio (PAPR). To maintain linearity of the transmitted radio frequency (RF) signal, high PAPR requires large power amplifier (PA) back-off (i.e., increasing the PA supply voltage to increase the source power of the supply relative to average transmitted RF signal power). The increased supply power provided to the PA insures that the PA is operating linearly when the RF signal is at its peak level. When the RF signal returns to its average level, the PA suffers a high power loss which is not converted to RF signal power. The additional power loss translates into increased heat dissipation within the PA. Thus by increasing the PA back-off to improve the linearity of the PA, it also causes a reduction in the PA efficiency and increased power usage. In many cases, limits on the heat dissipation or power consumption of the PA can become the bottleneck on the performance of the entire radio transmission system.

This situation becomes more severe in phased arrays since there is a plurality of PAs, each one of the plurality of PAs adding its heat output, due to the PA driving one of the antennas in the phased array. All of the PAs can be placed near the antennas, the antennas defining the planar area of the phased array. The close placement of the PAs together generates a significant amount of heat in a relatively small volume associated with the phased array. The heat dissipation becomes more severe if the PAs experience a high PAPR issue as mentioned earlier. The increased power loss of the PAs due to a high PAPR can generate a significant amount of heat in a very small volume. Moreover, a phased array may process multiple beam signals, and at the input of each PA, these beam signals are typically rotated and added. Techniques are required to reduce the high PAPR that PAs experience when multiple beam signals are added together. Reducing the PAPR allows the PA to become more power efficient.

BRIEF SUMMARY

In general, in one aspect, the invention features a system for use with a plurality of beam signals, the system including: a crest factor reduction (CFR) module having a plurality of inputs and a corresponding plurality of outputs, wherein each of the inputs of the plurality of inputs is for receiving a corresponding different beam signal of the plurality of beam signals and wherein each output of the plurality of outputs corresponds to a different input of the plurality of inputs and is for outputting a different CFR-adjusted signal of a plurality of CFR-adjusted signals, each CFR-adjusted signal of the plurality of CFR-adjusted signals corresponding to a different beam signal of the plurality of beam signals. The CFR module is configured to perform crest factor reduction on the plurality of beam signals to generate the plurality of CFR-adjusted signals. The crest factor reduction performed on the plurality of beam signals is based on a weighted sum of the magnitudes of multiple beams signals among the plurality of beam signals.

Other embodiments include one or more of the following features. The CFR module is configured to use the weighted sum of the magnitudes of multiple beams signals among the plurality of beam signals to determine when to reduce the magnitudes of the beam signals of the plurality of beams signals. The crest factor reduction performed on the plurality of beam signals is based on a weighted sum of the magnitudes of all of the beam signals among the plurality of beam signals. The weighted sum of the magnitudes of all of the beam signals among the plurality of beam signals is a sum of the magnitudes of all of the beam signals among the plurality of beam signals.

The system further includes a transmitter having a plurality of up-conversion modules, each electrically coupled to a corresponding different one of the outputs of the plurality of outputs of the CFR module and for up-converting a signal derived from the CFR-adjusted signal for that output; a combiner for combining signals from the plurality of up-conversion modules and generating a combined signal; and a power amplifier electrically coupled to the output of the combiner. The power amplifier has an output and the system further includes an antenna electrically connected to the output of the power amplifier. The CFR module includes a plurality of coordinate conversion modules, and wherein each coordinate conversion module of the plurality of coordinate conversion modules is coupled to a different corresponding input of the plurality of inputs and is for determining a magnitude of the beam signal received over that input. The CFR module further includes a plurality of multipliers, each multiplier of the plurality of multipliers coupled to a corresponding different coordinate conversion module; and it further includes an adder for adding signals derived from each of the coordinate conversion modules of the plurality of coordinate conversion modules to generate the weighted sum of the magnitudes of all of the beam signals of the plurality of beam signals. The CFR module also includes a peak detector for detecting when the weighted sum of the magnitudes of all of the beam signals of the plurality of beam signals exceeds a predetermined threshold. The crest factor reduction that the CFR module is configured to perform involves one or more of the following: hard clipping, peak cancellation, and iterative clipping.

In general, in one aspect, the invention features a method for processing a plurality of beam signals. The method includes: determining a magnitude of each beam signal of the plurality of beam signals; computing a weighted sum of the magnitudes of the plurality of beam signals; and performing crest factor reduction on the plurality of beam signals to generate a corresponding plurality of CFR-adjusted signals, wherein performing crest factor reduction on the plurality of beam signals is based on the computed weighted sum of the magnitudes of the plurality of beam signals.

Other embodiments include one or more of the following features. The method further includes: processing the plurality of CFR-adjusted signals to generate a plurality of processed signals; combining the plurality of processed signals to generate a combined transmit signal; and delivering the combined transmit signal to an antenna for wireless transmission. Performing crest factor reduction includes using the weighted sum of the magnitudes to determine when to reduce the magnitudes of any of the beam signals of the plurality of beam signals. All of the weights of the weighted sum of the magnitudes are equal to 1 or alternatively, one or more of the weights in the weighted sum of the magnitudes is not equal to 1. Performing crest factor reduction on the plurality of beam signals involves detecting when the weighted sum of the magnitudes of all of the beam signals of the plurality of beam signals exceeds a predetermined threshold. Performing crest factor reduction on the plurality of beam signals involves one or more of the following: hard clipping, peak cancellation; and/or iterative clipping.

The present disclosure will now be described in more detail with reference to particular embodiments thereof as shown in the accompanying drawings. While the present disclosure is described below with reference to particular embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

FIG. 17 presents the tabular results of three different standard test waveforms using the Multi-Beam CFR.

DETAILED DESCRIPTION

Figure 1:
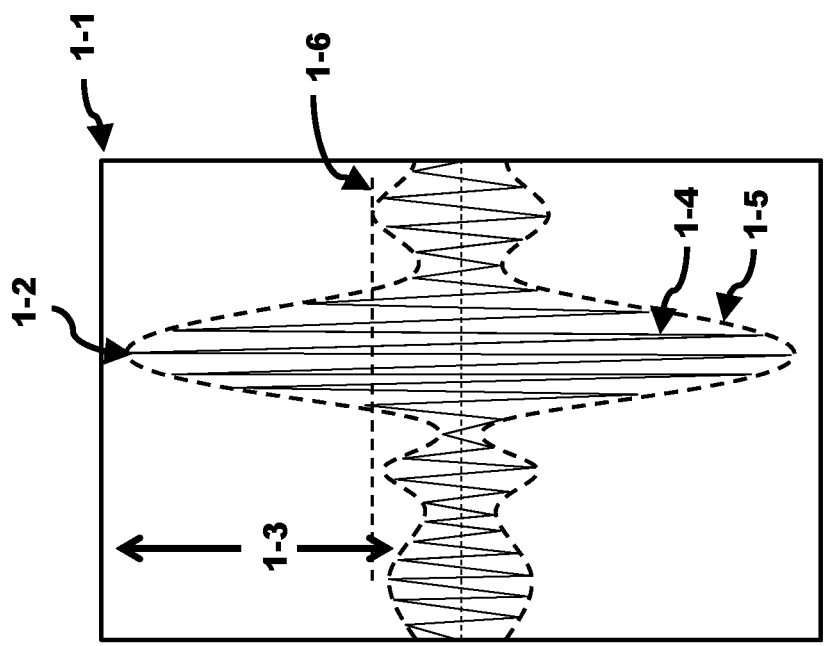
FIG. 1 shows a waveform illustrating the peak-to-average power ratio (PAPR) of a power amplifier.

FIG. 1 illustrates a transmitted radio frequency RF signal 1-4 within a baseband envelope 1-5. During peak signal events 1-2, the magnitude of the envelope can nearly extend to the fixed power supply amplifier supply voltage 1-1. The fixed power amplifier supply voltage needs to exceed the magnitude of peak signal events to maintain the linearity of the amplifier. However, in contrast to the peak signal events, the entire signal maintains a low average level 1-6. When measured in terms of the power of the signal, the ratio of the peak signal event 1-2 to the average power value corresponding to 1-6 is known as the peak-to-average power ratio (PAPR). It is desirable to maintain a PAPR with as low value as possible. Certain communication system signals, such as orthogonal frequency-division multiplexing (OFDM), can generate undesirably high PAPR, for which employing some technique for reducing the PAPR are desirable. The techniques introduced herein can be applied to any phased array communication system which experiences a high PAPR. The fixed power amplifier supply voltage must be capable of providing the large voltage swing at 1-2; however, when the signal amplitudes are closer to the average value 1-6 the power amplifier becomes less efficient. In these regions the energy provided by the fixed power amplifier supply voltage is dissipated as heat as illustrated by the gap in region 1-3. Thus, the design of the amplifier needs to ensure that the large peak signal events are amplified properly to maintain the linearity of the amplifier. However, when the average power of the power amplifier is much lower than the peak signal event, the power amplifier wastes a large amount of power as heat as indicated by the region 1-3.

The baseband envelope 1-5 (or baseband signal) is formed by a vector with two components: an in-phase (I) signal and a quadrature (Q) signal. The complex signal is typically represented by a complex number, where the real and imaginary parts correspond to the I and Q components of the signal, respectively. The vector has a magnitude and a phase. The magnitude of a baseband signal 1-5 is given by EQU. 1:

$$\sqrt{I^2+Q^2} \quad \text{(EQU. 1)}$$

The phase is determined by the relative values of the I and Q components.

Reducing the peaks of the baseband signal also reduces the peaks of the radio frequency (RF) signal. If the peaks are reduced, the PAPR is also reduced. Once the PAPR is reduced, the entire signal may be scaled to take up the range of the power amplifier (PA) supply voltage, which results in higher power efficiency (or, alternatively, the PA supply voltage may be lowered to the level of the reduced peaks reducing overall power dissipation).

Traditionally, in a single beam system, crest factor reduction (CFR) operation reduces the peak of the transmitted RF signal before being applied to the PA. The CFR module reduces the PAPR (typically by clipping, filtering, and/or a subtraction operation applied to the peak signal) while keeping the distortion to the signal at an acceptable level. In LTE systems, the CFR operation can cause in-band signal distortion, characterized by an EVM, while also causing out-of-band emission, as measured by ACLR. The goal of the CFR operation is to reduce the peak signals of the RF signal while maintaining the EVM and ACLR within acceptable limits. The net effect of reducing the peak signals causes the efficiency of the PA to improve. The CFR operation performs well on a system utilizing a single transmission RF signal or beam.

Figure 2:
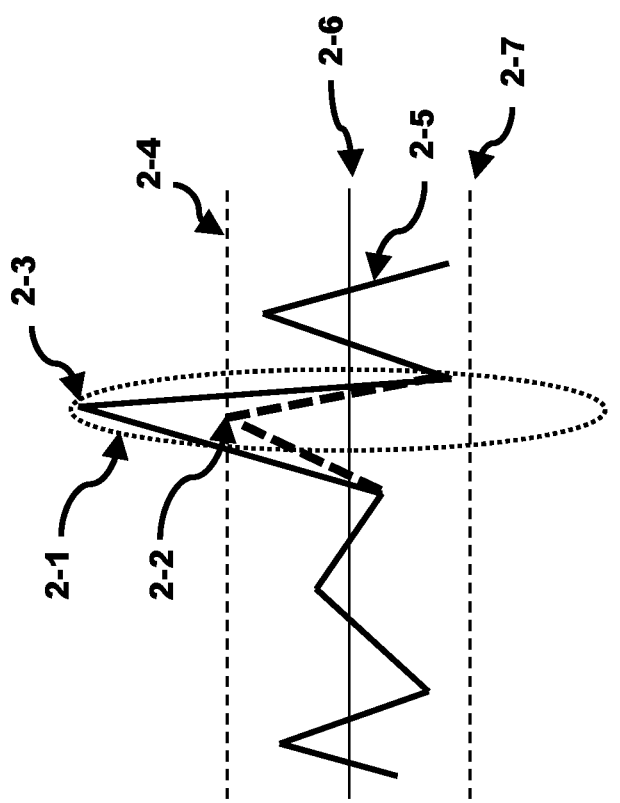
FIG. 2 depicts the crest factor reduction (CFR) of a signal that exceeds the threshold.

FIG. 2 pictorially illustrates in greater detail how the single beam CFR technique works. There is a baseband signal 2-5 with a signal peak 2-3 having its magnitude defined by the bounds of the dotted ellipse 2-1. The baseband signal has DC value 2-6 and CFR threshold values 2-4 and 2-7. The power ratio of the signal peak 2-3 to its average value specifies the PAPR. A lower PAPR is typically desired and will occur when the signal peak 2-3 is reduced to or below the threshold 2-4. The threshold is set based on system requirements imposed on the operation of the power amplifier. The conventional CFR technique identifies the location of the signal peak 2-3 exceeding the threshold and incorporates one of a plurality of signal reduction techniques to reduce the signal peak 2-3 to a lower signal peak 2-2 that matches or is less than the threshold 2-4. The power ratio of the lower signal peak 2-2 to its average value yields the desired PAPR. CFR can reduce the original PAPR of the signal to the desired PAPR after reducing the peak signal 2-3 to the lower signal peak 2-2. The desired PAPR can be reduced to about 6 to 8 dB while maintaining both the error vector magnitude (EVM) and the adjacent channel leakage ratio (ACLR) of the phased array within acceptable limits. This desired PAPR is maintained when the signal is applied to a power amplifier. However, this situation holds true only for a single beam system in which the conventional CFR techniques are employed.

A phased array is a more complex radio system. Two or more beam signals (independent transmission RF signals) are each phase shifted and added together. A Multi-Beam signal is the summation of two or more beam signals before being applied to the input of the PA and transmitted via one of the antennas of the phased array into free space. Applying the traditional CFR methods to each of the two or more beam signals reduces each of the beam signals to achieve the desired PAPR. However, once the two or more beam signals are added together, the PAPR of the combined beam signal can be greater than the desired value. The increase of the PAPR after addition is known as the regrowth of the PAPR or PAPR regrowth. This occurs because traditional CFR operates on one individual beam at a time independent of the other beams. The traditional CFR approach in a Multi-Beam signal is ineffective. Even if each of the two or more beam signals are processed using CFR, the summation of the two or more beam signals can regrow the PAPR by 2 to 3 dB once combined.

Figure 3:
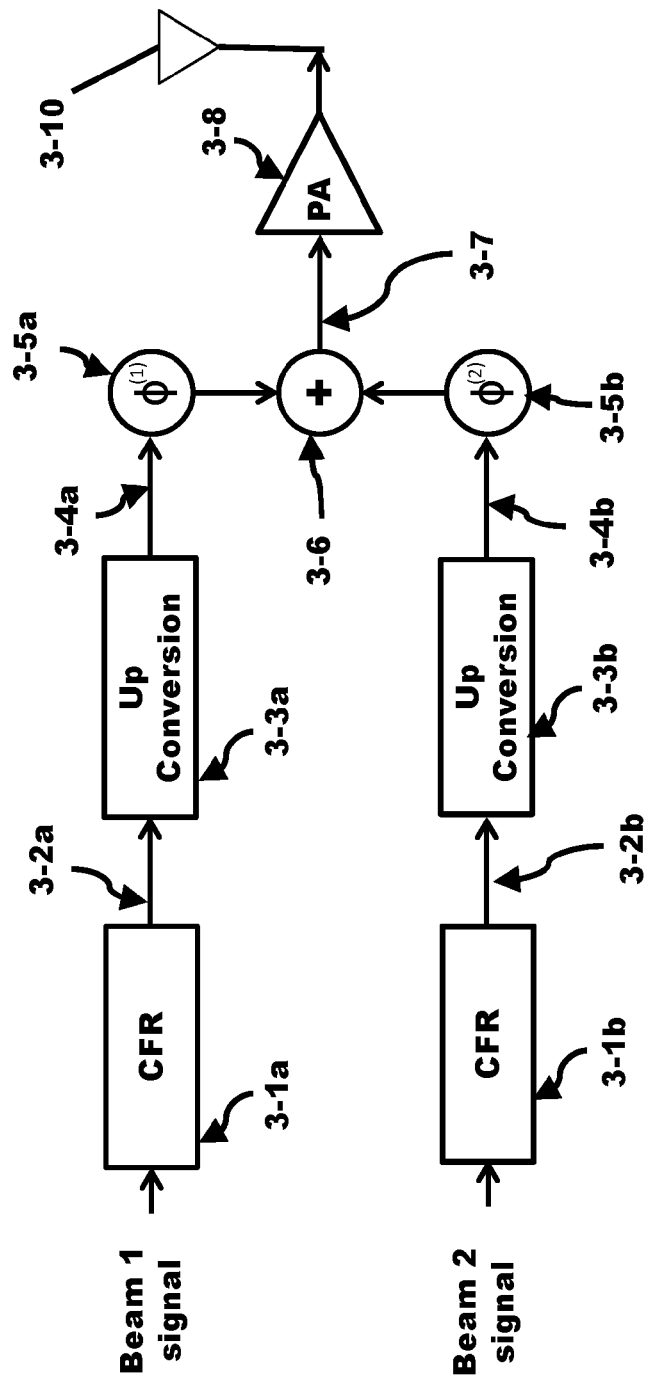
FIG. 3 shows traditional CFR applied individually to two beam paths then summed causing PAPR regrowth.

FIG. 3 illustrates how PAPR regrowth occurs in the Multi-Beam CFR architecture mentioned above. The beam 1 signal is applied to the CFR 3-1a which reduces the signal peaks within the beam 1 signal to the threshold generating a signal with a desired PAPR at node 3-2a. The signal at node 3-2a is up converted to RF frequencies in block 3-3a and applied to the phase rotator 3-5a at its input node 3-4a. The phase rotator adjusts the phase of the beam 1 signal and applies the signal to the input of the adder 3-6 and is for the purpose of controlling the direction of the resulting beam in the phased array system. Simultaneously, a second beam signal, the beam 2 signal, is applied to the CFR 3-1b which reduces the signal peaks within the beam 2 signal to the threshold generating a signal with a desired PAPR at node 3-2b. The signal at node 3-2b is up converted to RF frequencies in block 3-3b and applied to the phase rotator 3-5b at its input node 3-4b. The phase rotator 3-5b adjusts the phase of the signal and applies the signal to the input of the adder 3-6. The adder 3-6 combines the two signals from the phase rotators to generate the composite signal at node 3-7 that is applied to the power amplifier 3-8. The signal peak within the beam 1 signal is adjusted using the CFR technique independently of the beam 2 signal, while the signal peak within the beam 2 signal is adjusted using the CFR technique independently of the beam 1 signal. PAPR regrowth may occur at the output node 3-7 of the adder due to the independent CFR adjustment applied to the beam 1 signal and the beam 2 signal. The PAPR regrowth can increase the PAPR by as much as 3 dB causing the power amplifier to lose efficiency and dissipate more power than necessary when driving one of the antennas 3-10 of the phased array.

The PAPR of each individual beam in FIG. 3 is indeed reduced to a set maximum acceptable level as determined by the threshold after applying the traditional CFR. Once the beams are added together, the summation of the reduced power components of the individual beams, each at the set maximum acceptable level, can create an occurrence of a new PAPR condition raising the PAPR as much as 3 dB which effectively causes the operation of the traditional CFR operation applied to each of the individual beams to be undone. The PAPR of the combined beams returns close to the original PAPR value after the addition even though the tradition CFR operation was performed on the individual beams. The increase in the desired PAPR is due to the reduced peaks of one beam being aligned with the reduced peaks of a second beam and this can cause an increase in PAPR by as much as 3 dB. Hence, traditional single-beam CFR is not effective when multiple beams are combined or added.

Figure 4:
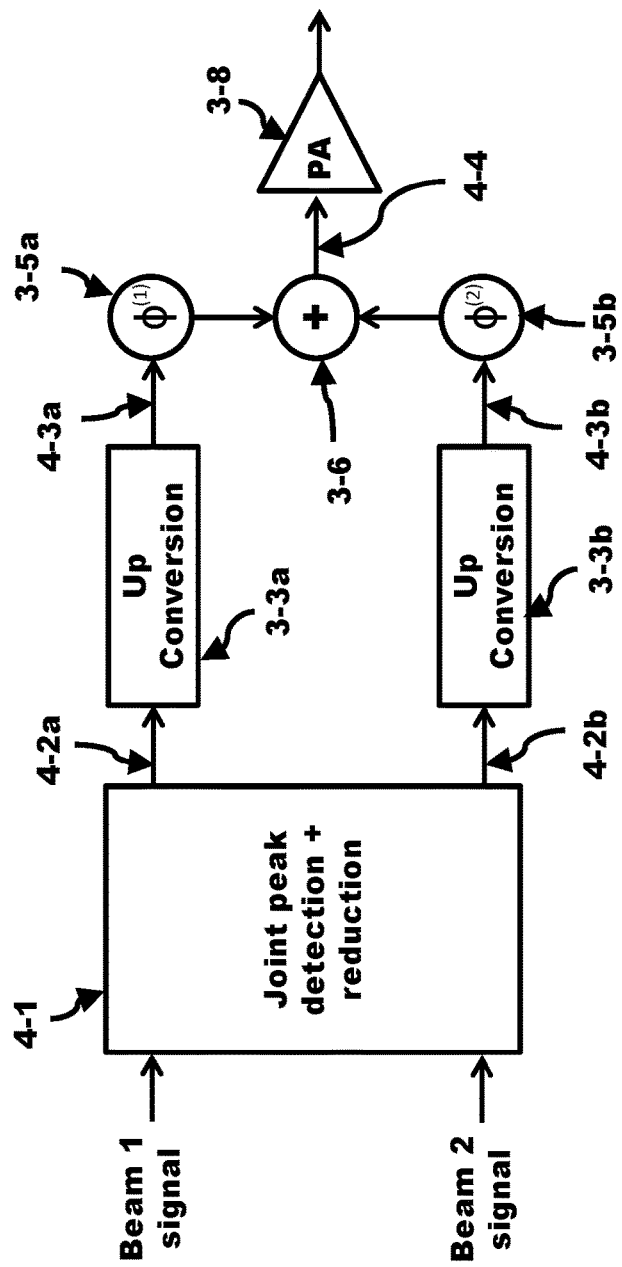
FIG. 4 depicts an embodiment of a dual-beam joint peak detection and reduction module or circuit that eliminates PAPR regrowth after addition.

FIG. 4 illustrates one embodiment in which PAPR regrowth is eliminated within the Multi-Beam CFR architecture. The beam 1 signal and the beam 2 signal are applied to a joint peak detection and reduction block 4-1. The magnitudes at any given time point of both beam signals are added and compared to a given threshold setting a joint PAPR. However, if the sum of the magnitudes is greater than the given threshold, and that local summation provides a local maximum, then PAPR of the summation is greater than the desired PAPR and a reduction of one or both of the signal components of the peak is performed. The reduction in the magnitude of any signal component introduces signal distortion into the waveform. The signal distortion can be tolerated, for example, in the LTE system, if the distortion that is introduced is within the error vector magnitude (EVM) limits as specified by the LTE standard. The two signals are then delivered to the transmitter (or front end) which is the portion of the system that prepares the signals for transmission over an antenna system (not shown). In the transmitter, each signal is up converted to RF frequencies by the up conversion block 3-3a and 3-3b, respectively. The phase rotators 3-5a and 3-5b rotate the magnitudes of the two input beam signals on nodes 4-3a and 4-3b and apply these signals to the adder 3-6. The adder 3-6 adds these two signals together to create the signal at node 4-4. This signal is applied to the input of the power amplifier 3-8. The joint peak detection and reduction block 4-1 implements a Multi-Beam CFR process, such that when the plurality of beams are added after arbitrary phase rotations, the combined beam signal exhibits no PAPR regrowth beyond a desired level at node 4-4 regardless of the amount of rotation. No PAPR regrowth means the PAPR of the combined signal does not exceed the combined signal PAPR target.

The phase rotator is used to lead or lag the phase angle of the RF signal of the beam signals. The phase rotators function to shift the phase of the signal passing through it. The shift in the phase is controlled with either analog or digital control signals. The described embodiment uses digital control signals to adjust the phase rotators. In addition, at least one amplitude adjustment circuit (a variable gain amplifier, not shown) controlled by the analog or digital control signal is used to modify the amplitude of at least one of the RF signals. Applying these phase rotations and gains is for the purpose of directing the resulting beam formed by the phased array in the desired direction. The control of the amplitude or phase adjustments can range from full, to partial, or to zero control. The digital control signals are bussed within the system and provided to the phase rotators and variable gain amplifiers in the up converters. These digital or analog control signals are supplied by one or more processors in a digital front end (DFE) which can include multiple interacting machines or computers. A computer-readable medium is encoded with a computer program, so that execution of that program by one or more processors performs one or more of the methods of phase and amplitude adjustment. For further details of the functionality of phase and amplitude adjustments, see, for example, U.S. Pat. Pub. No. 2012/0142280, entitled "Low Cost, Active Antenna Arrays," by Mihai Banu et al., published Jun. 7, 2012, the disclosure of which is incorporated herein by reference in its entirety.

In applications such as phased array systems, the phase of the transmit signals may be rotated by an arbitrary angle at each antenna element depending on the beam direction with respect to the phased array. Therefore, the Multi-Beam CFR method is based on the idea of rotational invariance: the sum of the beam signals, each of which may be subjected to an arbitrary phase rotation, is designed to meet the desired PAPR target. Furthermore, Multi-Beam CFR processes the transmission signals of the different beams jointly to detect and reduce the peaks of the combined beam signal. This embodiment simultaneously monitors the combined amplitudes of the plurality of signal beams at each time interval within the joint peak detection and reduction block. Once the combined amplitude exceeds a threshold, the joint peak detection and reduction block seeks to define the local maximum. Once the local maximum is located, CFR techniques are applied simultaneously to the plurality of signal beams to reduce the local maximum below a desired threshold. This joint peak detection and reduction embodiment ensures the combined beam signal exhibits no unacceptable PAPR regrowth after being added and before it is applied to the power amplifier.

Figure 5:
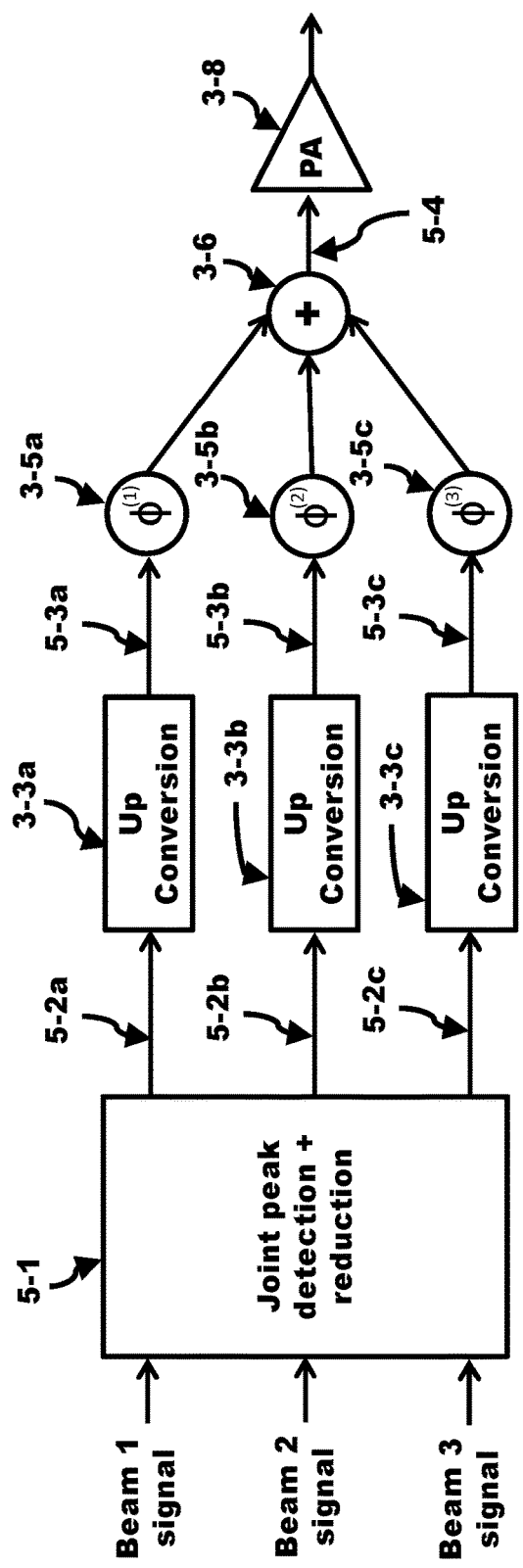
FIG. 5 presents an embodiment of a Multi-Beam joint peak detection and reduction module or circuit that eliminates PAPR regrowth after addition.

FIG. 5 illustrates an embodiment in which three beam signals are combined without experiencing PAPR regrowth at node 5-4. Three beam signals: the beam 1 signal, the beam 2 signal, and the beam 3 signal are applied to a joint peak detection and reduction block 5-1. Those in the art will understand that a plurality of beam signals of more than three can be processed in a similar manner. The amplitudes of each beam signal at any given time instant is added together, possibly with the application of a weighting function (to allow for unequal power allocation among different beam signals), to determine a summed amplitude value. The weight function can, for example, be used to assign an unequal power allocation relating to the distance of a handset separated from the base station. The beam signal for the handset closer to the base station can have a weight function that reduces the magnitude of the signal while the beam signal for the handset further from the base station can have a weight function that increases the magnitude of the signal since the signal has to travel further.

The summed amplitude value is calculated for each time step. The summed amplitude is compared against a threshold to determine if it exceeds that threshold. When the summed amplitude value exceeds the threshold, the amplitude of one or more of the three signal beams are reduced by using a peak reduction method. One approach involves proportionally reducing the amplitudes of all of the plurality of beam signals, another approach involves proportionally reducing the amplitudes of those beam signals that exceed a minimum amplitude. These reduction methods may use hard clipping, iterative clipping and filtering, and peak cancellation techniques, more detailed examples of which will be presented later. The goal of the joint peak detection and reduction block 5-1 is to reduce the peak magnitude to a value that is less than a desired amount (as specified by the threshold) such that the combined signal achieves the desired PAPR. This CFR operation should maintain the in-band signal distortion which is characterized by an error vector magnitude (EVM) and the out-of-band emission, which is measured by an adjacent channel leakage ratio (ACLR), within a predetermined limit. The three output signals: 5-2a, 5-2b, and 5-2c are each applied to a corresponding up conversion block 3-3a, 3-3b, and 3-3c, respectively. The up converted signal at nodes 5-3a, 5-3b, and 5-3c, are each individually phase shifted by the phase rotators 3-5a, 3-5b, and 3-5c, respectively. The adder 3-6 adds the phase-shifted signals together to generate the final RF signal on node 5-4 which is coupled to the power amplifier 3-8. There is no PAPR regrowth of the signal at node 5-4 because the three signals are jointly evaluated during the same time slice to correct for any combined amplitude that might exceed the threshold level.

Figure 6:
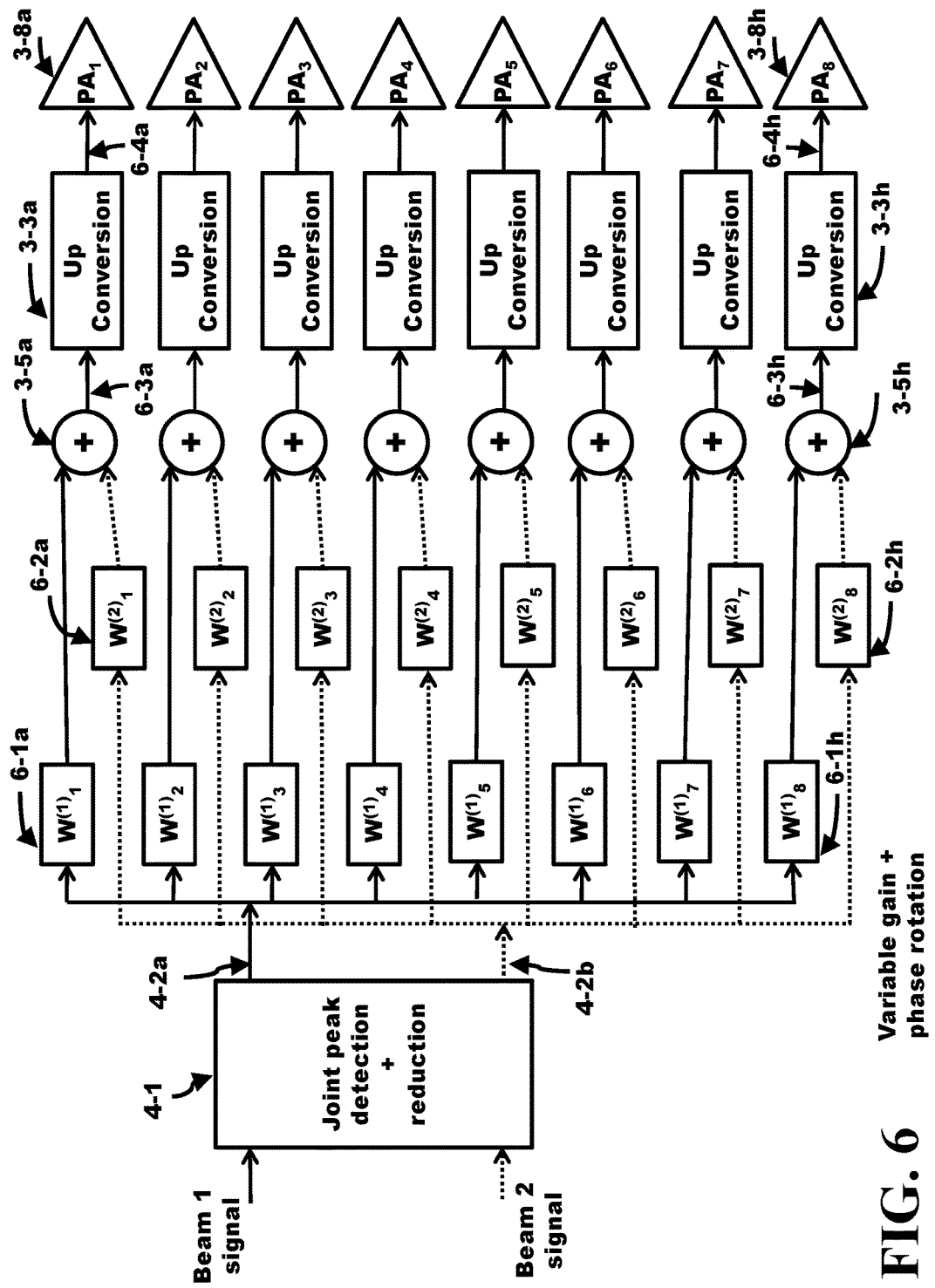
FIG. 6 presents an embodiment of a dual-beam joint peak detection and reduction module or circuit with each of the two beams distributed without PAPR regrowth to a plurality of power amplifiers after addition.

FIG. 6 depicts an embodiment of a joint peak detection and reduction block coupled to a plurality of power amplifiers of a phased array. In this embodiment, the beam steering weights/phases are introduced before up-conversion instead of after up-conversion, as in the embodiment of FIG. 5. FIG. 6 also shows two beam signals being distributed to a plurality of power amplifiers just as an illustration. In general, X beam signals may be distributed across Y power amplifiers. The two outputs signals at nodes 4-2a and 4-2b have been processed by the joint peak detection and reduction block 4-1. Either or both of the signals are phase rotated anywhere between 0° and 360° and added to form a composite signal. The composite signal formed by summing both of the signals will always be guaranteed to meet the desired PAPR after being processed by the joint peak and reduction block 4-1. The system of FIG. 6 generates eight composite signals that are up converted and applied to the input of a corresponding power amplifier. All eight of the power amplifiers will operate at or below the desired PAPR regardless of the phase shifts applied to the two CFR corrected input signals forming the composite signal. The eight power amplifiers each drive an antenna (not shown). The power dissipation of the power amplifiers is a significant portion of the overall power budget of the phased array. The savings in power due to maintaining the PAPR of the power amplifiers at the desired PAPR can either be used to reduce the power dissipation of the overall system or used to increase the average output power of the RF signal transmitted into free space. The eight antennas of the phased array can generate two separate radiation patterns in free space. The emitted wireless RF signals are reinforced in particular directions and suppressed in other directions depending on these phase and amplitude adjustments of the two input beam signals. For a further description of steered beams, see U.S. Pat. Pub. No. 2012/0258754, entitled "Techniques for Achieving High Average Spectrum Efficiency in a Wireless System" by Mihai Banu et al., published Oct. 11, 2012, the disclosure of which is incorporated herein by reference in its entirety.

The joint peak detection and reduction block 4-1 processes the input beam 1 signal and input beam 2 signal to detect signal peaks in the summation of the magnitudes of these two signals. CFR reduction techniques are applied to the two signals when the summed magnitude exceeds a given threshold. Once the peaks of the summed magnitude are reduced by the CFR technique to yield the desired PAPR, the output signals 4-2a and 4-2b of the joint peak detection and reduction block 4-1 are coupled to the variable gain and phase rotation blocks, labeled $W^{(i)}_j$. These two signals now possess the quality of rotational invariance. The output signal 4-2a is coupled to a first set of variable gain and rotation blocks 6-1a through 6-1h. The output signal 4-2b is coupled to a second set of variable gain and rotation blocks 6-2a through 6-2h. Rotational invariance ensures that these variable gain and phase rotation blocks can phase rotate either one or both of the signals of 4-2a and 4-2b over the full range of 0 to 360° while maintaining the desired PAPR after being summed together. Each of the eight adders 3-5a through 3-5h generates a composite signal on nodes 6-3a through 6-3h. Each composite signal comprises the summation of a first signal selected from the first set with a second signal selected from the second set to form one of the composite signals. Each of the composite signals are up converted by the up conversion blocks 3-3a through 3-3h to generate the RF signal on nodes 6-4a through 6-4h, respectively. Each of these RF signals are applied to a corresponding input of one of the power amplifiers. FIG. 6 shows a configuration for 2 beams, with the signal of each beam being distributed to a set of eight power amplifiers (PAs). In general, the configuration may have X beams (e.g., 2 or more) with Y PAs (e.g., greater than eight).

FIGS. 3-5 show only phase rotations. In general, the data path for a given beam to a given power amplifier may go through a variable gain and phase rotation, represented by a complex scaling factor $W^{(i)}_j$, as shown in FIG. 6. It is a complex scaling factor because in general it has a real (in-phase, or I) and an imaginary (quadrature, or Q) component. The significance is that this factor not only scales the magnitude of the signal, but it also rotates the signal on the I-Q plane. The variable gains are set a priori. Then, the operator sets the Multi-Beam CFR weighting function and threshold accordingly, so that the variable gains are taken into account. So, the variable gain does not affect the quality of the rotational invariance.

The joint peak detection and reduction block 4-1 processes the signals with the CFR techniques to reduce the PAPR to a desired PAPR. A variable gain that is applied to one of the signals causes the same gain to be applied to the peak power as well as the average power of that one signal. Therefore, the desired PAPR remains a constant independent of the magnitude of the variable gain. The up-conversion operation (converting a baseband signal to a radio frequency signal) may take place before phase rotation as illustrated in FIGS. 3-5 or after the phase rotation as presented in FIG. 6.

Figure 7:
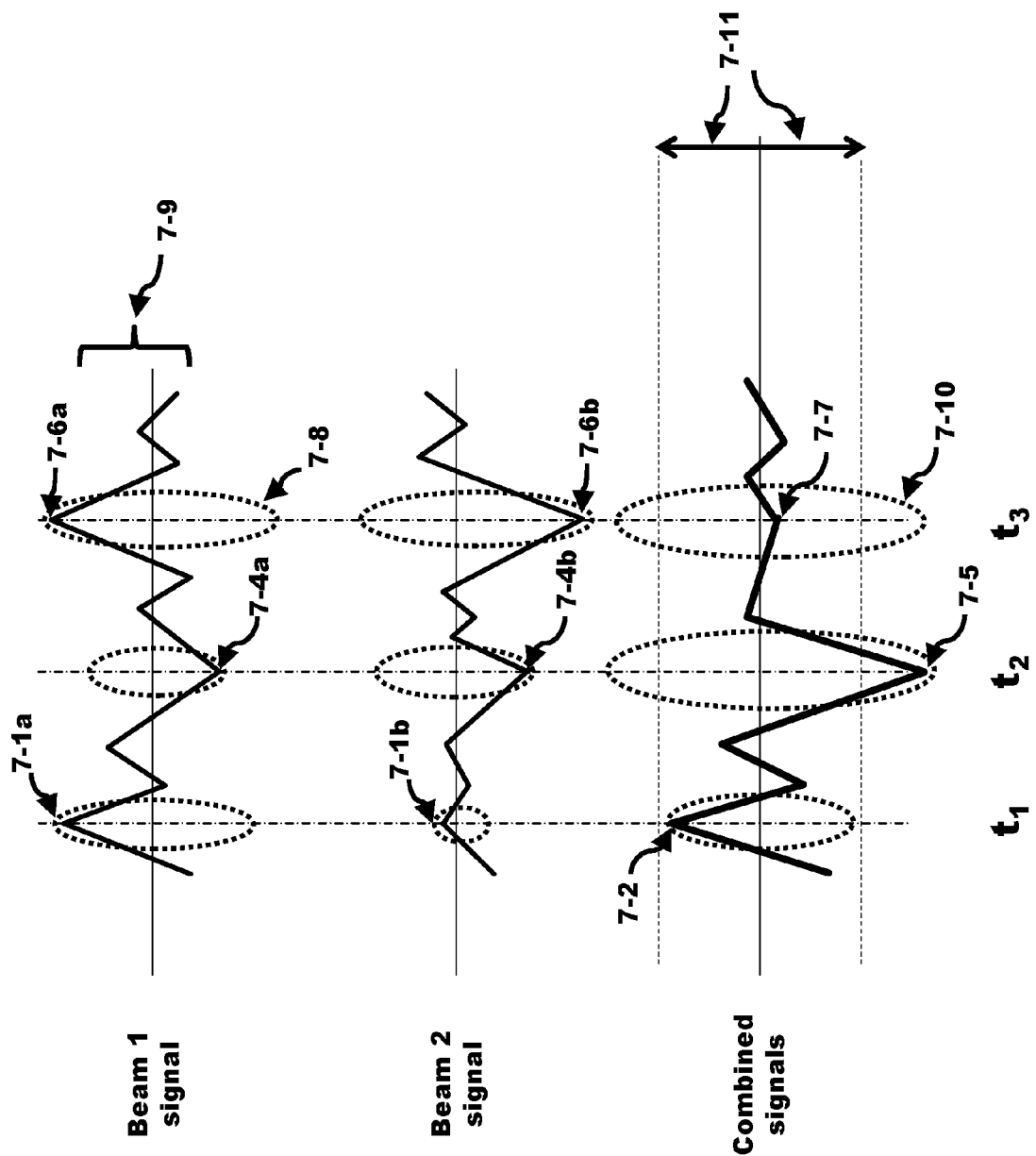
FIG. 7 presents a graphic representation of determining locations where the combination of two signals requires peak reduction.

In traditional CFR, peak reduction is performed on a single beam signal independent of any other beam signal if the signal magnitude exceeds a given threshold. In contrast, in Multi-Beam CFR, peak reduction is performed when the sum of the magnitudes of the individual beam signals exceeds a given threshold. Sum of the magnitudes of the vectors representing the signals, as opposed to magnitude of the sum of the vectors, is considered so that the operation is invariant to the phase rotations of the individual beam signals. FIG. 7 illustrates waveforms depicting one example embodiment of the Multi-Beam CFR method. Three aligned waveforms are illustrated as a function of time. The top two waveforms represent the sampled input beam 1 signal and the sampled input beam 2 signal. The bottom signal represents the summation of the two input signals as a composite signal. Each of the waveforms identifies three amplitude values corresponding to the time points of $t_1$, $t_2$, $t_3$. A dotted ellipse is associated with each of the identified amplitude values. The dotted ellipse can represent a circle projected on an I and Q plane, this plane is perpendicular to and sticking out of the page of each of the dashed lines associated with the time points. The radius of the circle corresponds to the amplitude of the signal in the I and Q plane. At time point $t_1$, the beam 1 signal has an amplitude 7-1a at 90° while the beam 2 signal has an amplitude of 7-1b at 90°. When the amplitudes of the two beam signals are added together they generate a combined peak signal 7-2 at 90°. Note that because the two input vectors are aligned, their summation generates the maximum value for this vector addition as though the magnitude of the vectors have been added. The value of this peak signal 7-2 is less than the desired threshold 7-11 and therefore would not require the application of the Multi-Beam CFR method. At time point $t_2$, the beam 1 signal has an amplitude 7-4a at 270° while the beam 2 signal has an amplitude of 7-4*b* at 270°. When the amplitudes of the two beam signals are added together they generate a combined peak signal 7-5 at 270°. Again note that because the two input vectors are co-linear, their summation generates the maximum value for this magnitude addition as though the magnitude of the vectors have been added. The value of this peak signal 7-5 is more than the desired threshold 7-11 and therefore would require the application of the Multi-Beam CFR method. In one embodiment of the Multi-Beam CFR method, the amplitudes of the input signals at 7-4*a* and 7-4*b* are reduced proportionally until the summed magnitude 7-5 is reduced below the desired threshold 7-11. At time point $t_3$, the beam 1 signal has an amplitude 7-6*a* at 90° while the beam 2 signal has an amplitude of 7-6*b* at 270°. When the amplitudes of the two beam signals are added together they generate a combined peak signal 7-7 at 270°. The value of this peak signal 7-5 is within the desired threshold 7-11 but this represents the magnitude result of a vector addition. The addition of the magnitude of the vectors is represented by the dotted ellipse 7-10, which exceeds the threshold 7-11, and therefore would require the application of the Multi-Beam CFR method. The amplitudes of the input signals at 7-6*a* and 7-6*b* can be reduced proportionally until the summed magnitude 7-10 is reduced below the desired threshold 7-11. The Multi-Beam CFR method reduces the magnitudes of the individual signals if the sum of individual magnitudes is greater than a desired threshold (note that sum of individual signals may or may not exceed the desired threshold). The Multi-Beam CFR method does not need to reduce the magnitudes of the individual signals if sum of individual magnitudes is within desired threshold. The Multi-Beam CFR method can use any existing method to reduce the peaks, e.g., iterative clipping and filtering (ICF), peak cancellation (PC), and hard clipping (HC).

Figure 8:
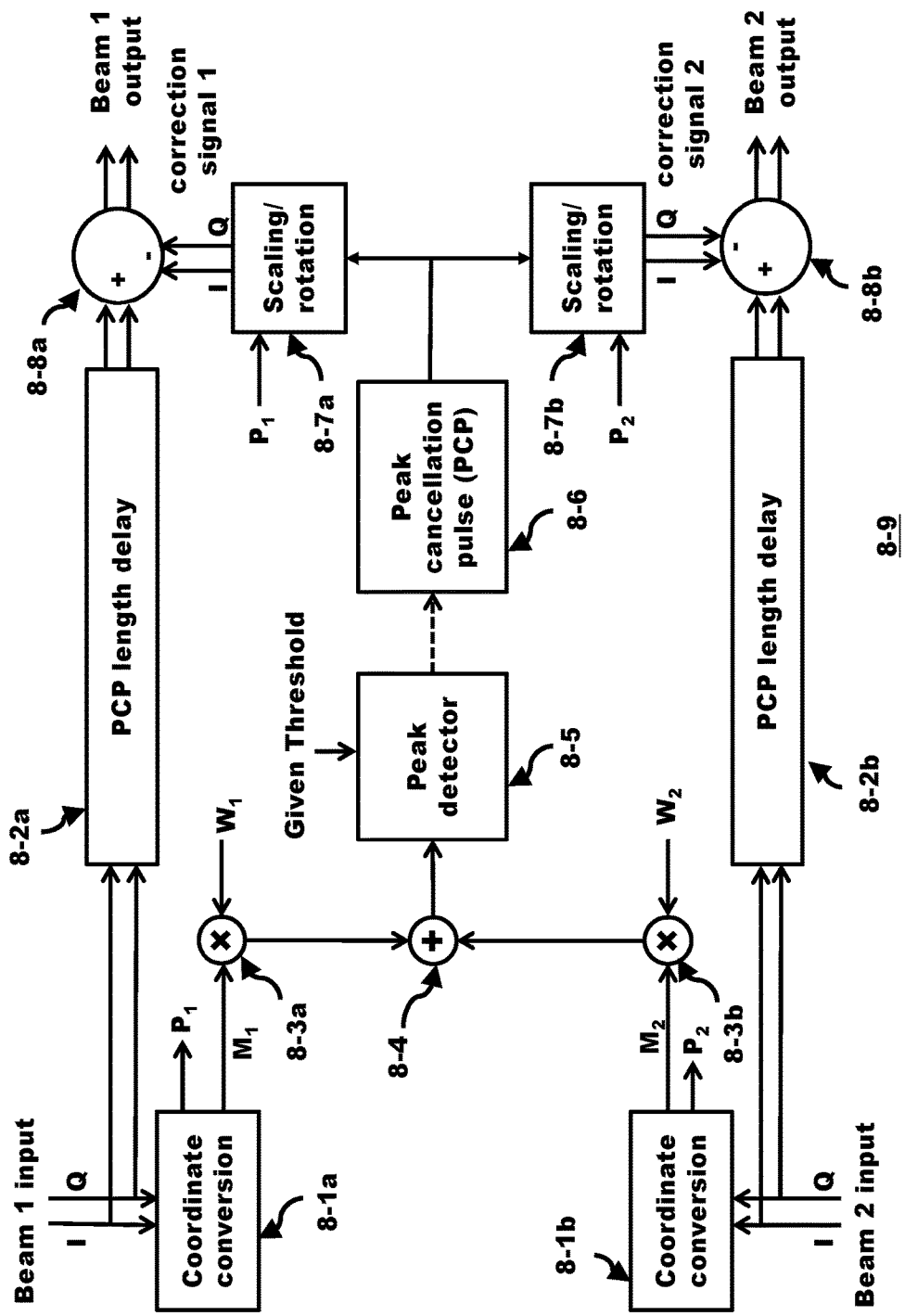
FIG. 8 is a block diagram of a module or circuit that performs a single iteration of a Multi-Beam CFR with peak reduction.

FIG. 8 presents a functional block diagram of Multi-Beam CFR peak cancellation (CFR-PC) circuit or module within the joint peak detection and reduction block 4-1. In general, the peak of the transmit signal is reduced by subtracting an appropriately scaled and rotated peak cancellation pulse (PCP) from the transmit signal. The PCP is typically based on the impulse response of the pulse-shaping filter, so that subtracting the scaled/rotated PCP would not significantly impact the bandwidth of the transmit signal. The peak of the PCP is made to align with the peak of the transmit signal. The PCP is scaled to control the peak reduction amount (i.e., the magnitude to be subtracted), and the PCP is rotated to align with the angle of the transmit signal's peak on the I-Q plane. A PCP is used to subtract away the peaks of beam signals to ensure the correction signal is "smooth", i.e., there is no abrupt changes in the beam signals after the correction, which translates into minimal spectral distortion of the beam signals. A reference to this technique can be found at: http://www.xilinx.com/products/intellectual-property/ef-di-pc-cfr.html.

The input beam signals are applied to the module and the CFR beam signals are output from the module, which corresponds to one iteration of CFR correction. The I and Q of two input beams, beam 1 input and beam 2 input, which are delivered to the module, propagate through a peak cancellation pulse (PCP) length delay block 8-2*a* and 8-2*b* to combiners 8-8*a* and 8-8*b*, respectively. The length delay blocks serve to temporally align the peak of the peak cancellation pulse (PCP) with the peak of the beam input signal at the combiner 8-8*a* taking into account the delays that are introduced by the peak detector 8-5 and PCP module 8-6.

The pulse length delay block effectively provides a delayed version of the input signal to the combiner. Simultaneously, the magnitude and phase of the two inputs is extracted by coordinate conversion blocks 8-1*a* and 8-1*b* to generate the magnitudes $M_1$ and $M_2$ and the phases $P_1$ and $P_2$, respectively. The magnitudes are then scaled in the multipliers 8-3*a* and 8-3*b* by a weight function $W_1$ and $W_2$, respectively. The weight function is used, for example, to account for the distance of a handset from the base station and is for the purpose of allowing for unequal power allocation among different beam signals. An adder 8-4 adds the two resulting magnitudes and applies the output to a peak detector 8-5. In the Multi-Beam peak detector, the weighted sum of beam signal magnitudes is compared to a given threshold. (Note that in general when referring to a weighted sum that is not meant to exclude the case in which all of the weights are equal to one.) The peak detector 8-5 detects the peaks of the combined magnitude that are above that given threshold. A peak cancellation pulse (PCP) block 8-6, which stores a pre-recorded PCP, is used to shape the spectrum of the correction signal to keep the ACLR deterioration small. When a peak that is above the threshold is detected, the pre-recorded PCP is scaled for each of the different beams and subtracted from them. Typically, the PCP is based on the impulse response of the transmit pulse-shaping filter, which is a filter that is used to ensure the bandwidth of the transmit signal is within the bandwidth of the communications channel (e.g. see FIG. 15 for a typical transmitter chain. The transmit pulse-shaping filters are used in 15-1*a* and 15-1*b*.) The amount over the given threshold together with the incoming signal phases $P_1$, $P_2$ are used to scale and rotate the PCP in scaling/rotation blocks 8-7*a* and 8-7*b* to generate a correction signal 1 and a correction signal 2. Though not explicitly shown, it is assumed the weights W's are known by the scaling/rotation module. (Note that the figure illustrates the main data paths and not all control paths are shown.) The rotation is necessary because the peak of the beam input signal occurs at a certain angle on the I-Q plane and it is necessary to rotate the PCP to match the angle at which the peak occurs in the beam input signal. Combiners 8-8*a* and 8-8*b* subtract the correction signals from the delayed beam signals provided by the PCP length delay blocks to reduce the PAPR to the desired level.

This set of procedures may be iterated multiple times to ensure that most peaks are cancelled in the transmit signal. This means that in the hardware, multiple copies of FIG. 8 would be present. The Beam 1, 2 outputs of the preceding copy would be connected to the Beam 1, 2 inputs of the subsequent copy, respectively. Multiple iterations might be necessary when the beam input signal has closely spaced peaks or wide peaks. A single iteration may only process a portion of the peaks due to, e.g., limited hardware processing capability. When implemented in hardware or software, multiple copies of PCP generators and scalers (not illustrated) may be used to cancel closely spaced peaks in the same iteration. In a hardware implementation, when the PCP generator is active producing the sample values of a peak cancellation pulse, the hardware is busy for the duration of the peak cancellation pulse. Therefore, if within this duration there is another peak in the beam input signal that we need to cancel, another set of PCP generator and scaling/rotation hardware is needed The PCP for each beam is scaled proportionally with respect to the magnitudes of the individual beam signals. For instance, in the dual-beam embodiment shown in FIG. 8, let $M_1$, $M_2$ be the beam signal magnitudes for the current sample time instance, and $W_1$, $W_2$ be the beam combination weights. If the weighted sum of magnitudes $W \triangleq W_1 M_1 + W_2 M_2$ is deemed to be a peak and exceedingly large with $W > T + \Delta$, where T is the given threshold and $\Delta$ is a threshold margin, then PCP's for beam 1 input and beam 2 input will be scaled, respectively, with:

$$S_1 = M_1\left(1 - \frac{T}{W}\right) \quad \text{(EQU. 2)}$$

$$S_2 = M_2\left(1 - \frac{T}{W}\right) \quad \text{(EQU. 3)}$$

The purpose of the threshold margin $\Delta$ is for bypassing insignificant peaks, and $\Delta \approx 0.01 T$ is found to be a good value. In FIG. 8, each of beam 1 and beam 2 signals is a complex baseband channel, i.e., each channel has an in-phase (I) and quadrature (Q) component. The scaling/rotation block 8-7a and 8-7b, in particular, are designed to independently scale the I and Q components for each channel to achieve the desired magnitude scaling and phase rotation of the PCP for the respective channel.

A particular method of distributing the reduction of the excess magnitude (i.e., the overage of the weighted sum of the beam magnitudes above the threshold) amongst the individual beam signals, namely, proportional distribution, was presented above. In some cases, the performance of the Multi-Beam CFR embodiments can be improved by a small signal protection method, in which an individual beam's magnitude is never reduced below a given level.

For example, in the two-beam scenario, let $L_1$, $L_2$ denote such small signal protection levels, and let $Z_1$, $Z_2$ be the smaller of the beam magnitudes and the protection levels, respectively:

$$Z_1 \triangleq \min(M_1, L_1) \quad \text{(EQU. 5)}$$

$$Z_2 \triangleq \min(M_2, L_2) \quad \text{(EQU. 6)}$$

Then, the small signal protection PCP scaling factors are given by:

$$S'_1 = M_1\left(1 - \frac{T'}{W}\right) - Z_1 \quad \text{(EQU. 7)}$$

$$S'_2 = M_2\left(1 - \frac{T'}{W}\right) - Z_2 \quad \text{(EQU. 8)}$$

where $T' \triangleq T - Z_1 - Z_2$ is the combined magnitude threshold after taking into account of the small signal protection levels. Empirically, it is found that $L_1 \approx 0.02 M_1$, $L_2 \approx 0.02 M_2$ are small signal protection levels that exhibit good performance.

The reduction of the excess magnitude (i.e., W−T) is being distributed to the individual beam signals. The distribution is performed such that each individual beam signal is never reduced to be smaller in magnitude than the levels $L_1$, $L_2$. Then the remaining reduction amount is divided proportionally (proportional to the beam input magnitudes $M_1$, $M_2$ amongst the individual beam signals.

The magnitude of the PCP is multiplied by the scaling factors $S_1'$, $S_2'$ to form the scaled correction signals.

While the Multi-Beam CFR-PC architecture described above is applicable with most peak detector implementations, an embodiment describing an immediate-neighbor peak detector is assumed in the following discussions (though it is expected that the peak cancellation approach would be applicable with other peak detector implementations with suitable adaptations). According to the immediate-neighbor approach:

$$W_i > W_{i-1} \bigwedge W_i \geq W_{i+1} \xrightarrow{\text{yields}} W_i \text{ is peak} \quad \text{(EQU. 4)}$$

where the subscript indicates sample time instance. Thus $W_i$ is deemed a peak if it is larger than its preceding and succeeding neighbors. Similar to a traditional CFR-PC module, multiple iterations of the above steps may be performed to ensure most peaks are cancelled in the combined signal.

The output signals of the beam 1 output and the beam 2 output from the Multi-Beam CFR process are no longer independent. In fact, the output signals become dependent in a complementary way: when one signal is small in the magnitude, the other signals are allowed to be large. It is precisely this complementary dependency that gives rise to the Multi-Beam CFR property that the beam signals meet the desired PAPR target when they are added up.

At the output of the joint peak detection and reduction block in FIG. 8, the sum of the beam signals meets the desired PAPR target. However, the PAPR's of the individual beam signals need not be the same as the PAPR of the combined signal. In some applications where PAPR design constraints exist for both the individual beams and the combined signal, traditional single-beam CFR modules may be prepended to the Multi-Beam CFR module, as will be described in FIG. 12, where multiple iterations of Individual+Multi-Beam CFR operations are presented. In general, the Individual CFR stage may have different thresholds and number of iterations from the Multi-Beam CFR stage.

Figure 9:
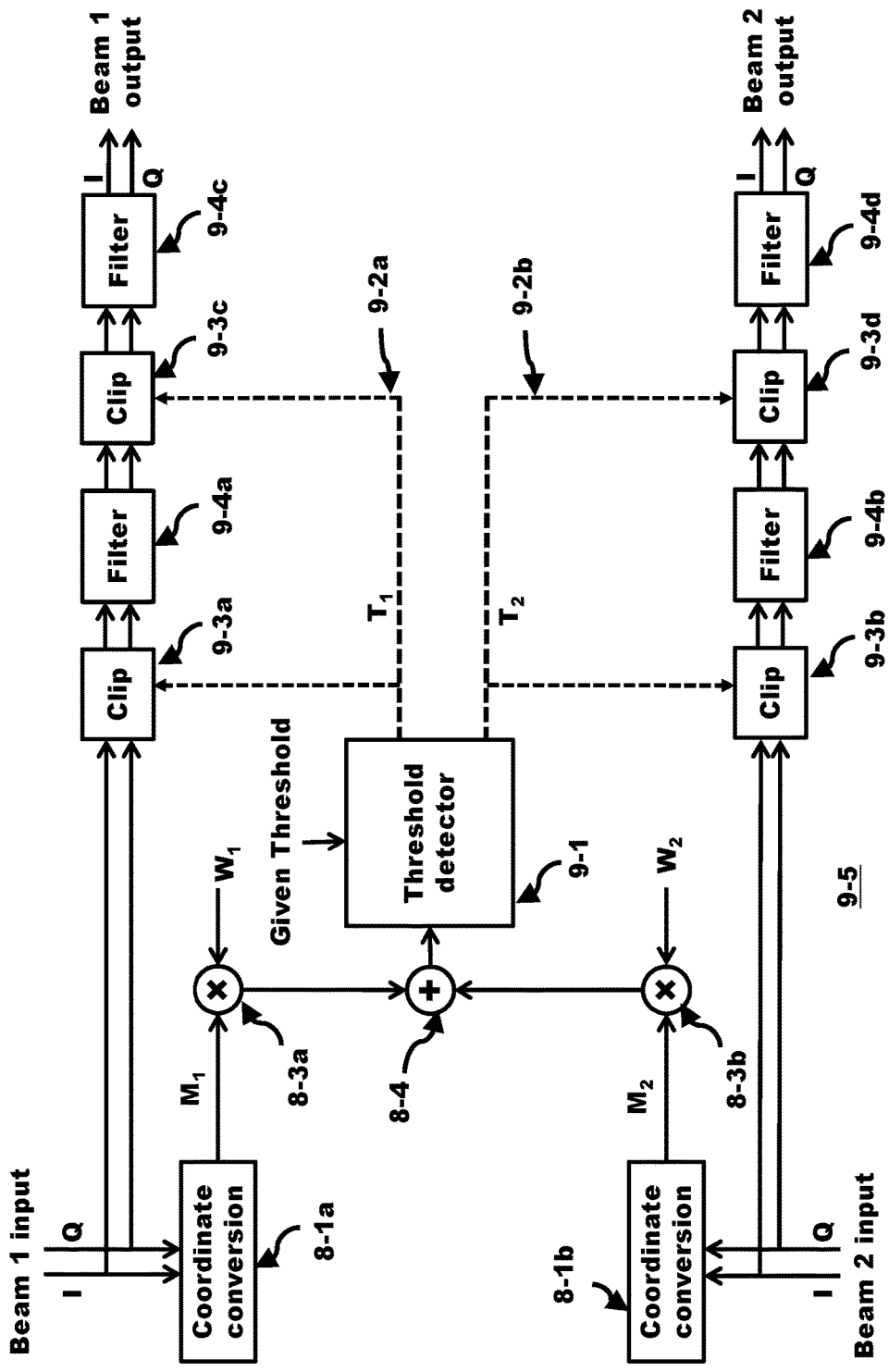
FIG. 9 is a block diagram of a module or circuit that performs a single iteration of a Multi-Beam CFR with clipping and filtering.

FIG. 9 depicts a functional block diagram of the joint peak detection and reduction block 4-1 in a Multi-Beam CFR system using iterative clipping and filtering. The input beam signals are delivered to the module and the beam signals after being CFR'ed are output from the module. The I and Q of two input beams, beam 1 input and beam 2 input, that are delivered to the module, and are coupled to the clip blocks 9-3a and 9-3b, respectively. The clip blocks clip the peaks that exceed the given threshold. Simultaneously, the magnitude of the two inputs is extracted by the coordinate conversion block 8-1a and 8-1b to generate the magnitudes $M_1$ and $M_2$, respectively. These magnitudes are then scaled in the multipliers 8-3a and 8-3b by a weight function $W_1$ and $W_2$, respectively. An adder 8-4 adds the two resulted magnitudes and applies the resultant output to a threshold detector 9-1. In the Multi-Beam peak detector 9-1, a weighted sum of beam signal magnitudes is compared to a given threshold. The threshold detector 9-1 compares the resultant output with a given threshold and assigns beam thresholds $T_1$ on node 9-2a for the clip blocks associated with the beam 1 and $T_2$ on node 9-2b for the clip blocks associated with the beam 2. Note that it is assumed, as was the case with earlier descriptions, that $W_1$, $W_2$ are known to the modules that require that information. The figure shows the main data paths and some of the control path dependences are not shown.

For proportional distribution of the clipping thresholds, $T_1$ and $T_2$ are set as follows. If the weighted combined magnitude $W \triangleq W_1 M_1 + W_2 M_2$ is less than or equal to the threshold T, the clipping blocks are not activated. Otherwise, the $T_1$, $T_2$ thresholds are set as follows:

$$T_1 = M_1 T/W$$

$$T_2 = M_2 T/W$$

The clip blocks 9-3a and 9-3b clip the beam input signals according to the beam thresholds that they each received. After clipping the peaks, the spectrum of the beam signal would broaden and it would exceed the bandwidth of the transmission channel. To restore the beam signal to its original bandwidth, a filtering step is applied. So, after the beam input signals are clipped, the following filter 9-4a and 9-4b filters the beam input signals. The implementation of the filter is a design choice. Typically, it will be a pulse-shaping filter similar to 15-1a in FIG. 15. The block sequence of the clip block followed by the filter block corresponds to one iteration of CFR correction. The resultant signal after a single iteration of clipping and filtering is available at the beam one output and beam two output, respectively.

It is the case that filtering causes signal peaks to reappear, although to a lesser extent than the original peaks. Thus, it has been found that a repeated application of clipping and filtering can be used to reduce the peaks while minimizing the spectral broadening. A single cycle of clipping and filtering, as shown in FIG. 9, can be used, but it would typically have poor peak reduction or distortion performance. So, in practice multiple iterations of the above steps are typically performed. For more details on iterative Clipping and Filtering refer to J. Armstrong, "Peak-to-average power reduction for OFDM by repeated clipping and frequency domain filtering," ELECTRONICS LETTERS, Vol. 38, No. 5, February 2002.

Figure 10:
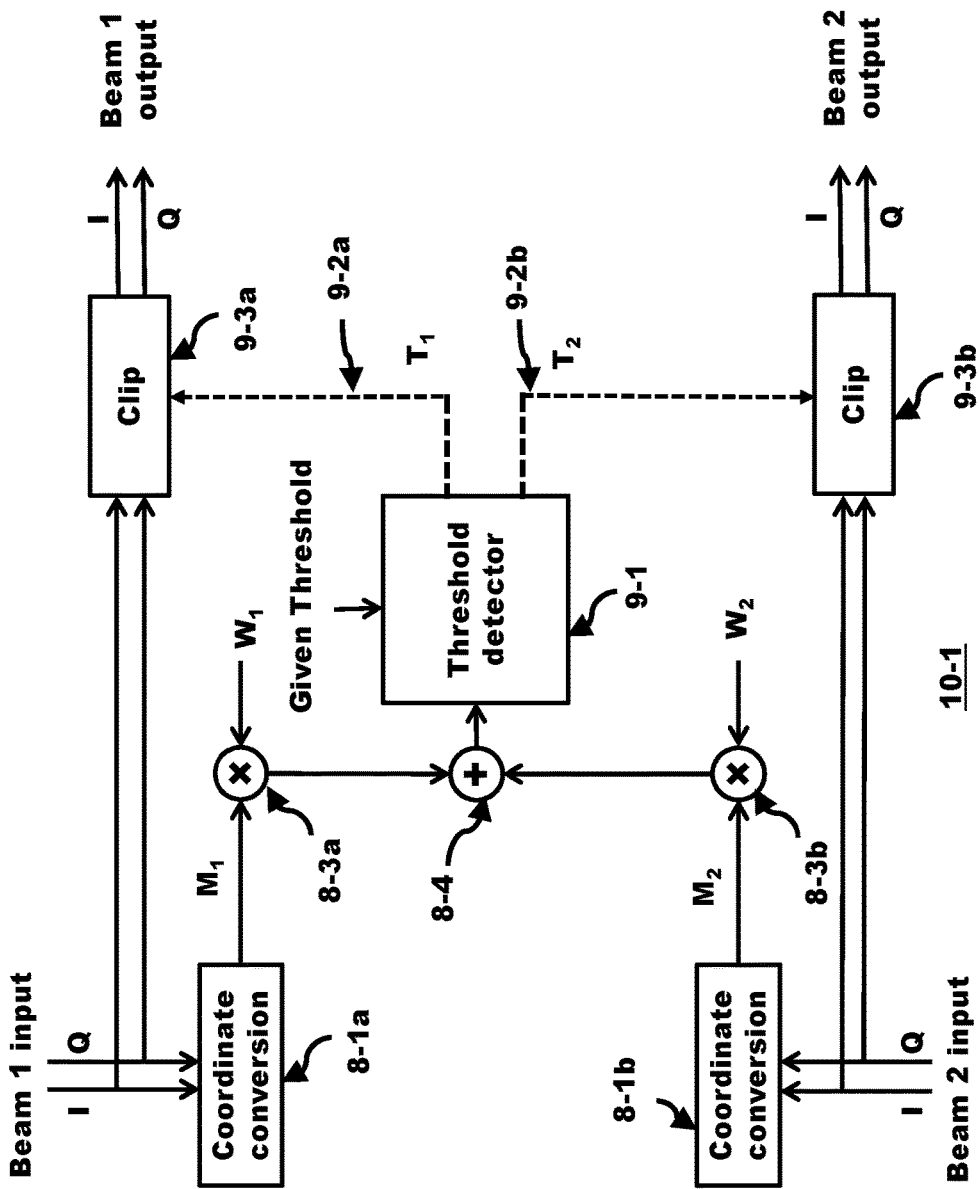
FIG. 10 is a block diagram of a module or circuit that performs a single iteration of a Multi-Beam CFR with hard clipping.

FIG. 10 illustrates an embodiment of the joint peak detection and reduction module 4-1 including a Multi-Beam CFR that employs hard clipping. The inputs beam signals are delivered to the module and the beam signals after being CFR'ed are output from the module. The I and Q of two input beams, beam 1 input and beam 2 input, that are delivered to the module, are coupled to clip blocks 9-3a and 9-3b, respectively. The clip blocks clip the peaks that exceed the given threshold. Simultaneously, the magnitudes of the two inputs are determined by coordinate conversion blocks 8-1a and 8-1b to generate magnitudes $M_1$ and $M_2$, respectively. These magnitudes are then scaled in the multipliers 8-3a and 8-3b by a weight function $W_1$ and $W_2$, respectively. An adder 8-4 adds the two resulting weighted magnitudes and applies the resultant output to a threshold detector 9-1. In the Multi-Beam peak detector, the weighted sum of beam signal magnitudes is compared to a given threshold. The threshold detector 9-1 compares the resultant output with a given threshold and assigns beam threshold $T_1$ on node 9-2a for the clip block 9-3a associated with the beam 1 and assigns beam threshold $T_2$ on node 9-2b for the clip block 9-3b associated with the beam 2. The clip blocks 9-3a and 9-3b clip the beam input signals according to the beam thresholds that they each received. The single block sequence of the clip block corresponds to one iteration of CFR correction. The resultant signal after one iteration of hard clipping is available at the beam one output and beam two output, respectively.

Figure 11A:
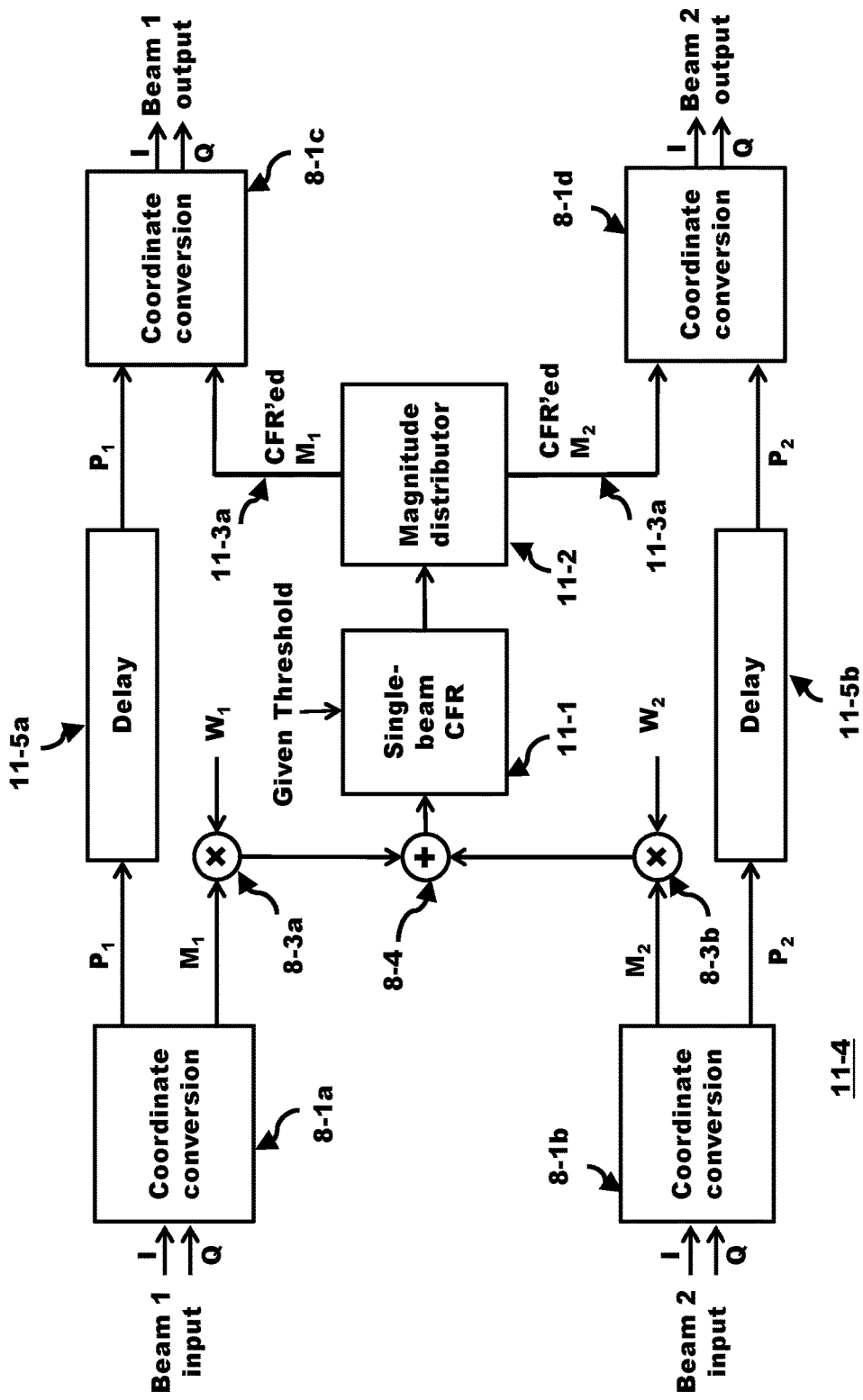
FIG. 11A is a block diagram of a module or circuit that performs Multi-Beam CFR using embedded single-beam CFR module.

In applications where traditional single-beam CFR modules are available to be used (e.g., to reduce overall implementation effort, or to leverage certain attributes of the existing modules), Multi-Beam CFR may also be realized by supplying custom logic around the single-beam CFR modules. Such an architecture is shown in FIG. 11A. In this two-beam example, the magnitudes of Beam 1 and 2 signals, possibly weighted by W, $W_2$, respectively, are summed to form the input to a traditional single-beam CFR module. The output of the traditional single-beam CFR module is then used to form the magnitudes of the individual beam's signals. For each beam, the modified per-beam magnitude together with the beam's original phase (after appropriate delay) are used to reconstruct the I, Q components of the per-beam CFR'ed signal. For instance, the traditional CFR module may be a single-beam iterative clip and filter CFR module, or a single-beam peak-cancellation CFR module.

FIG. 11A depicts an embodiment of the joint peak detection and reduction module 4-1 including a Multi-Beam CFR that also employs an embedded single beam CFR method. The input beam signals are delivered to the module and the beam signals after being CFR'ed are output from the module. The I and Q of two input beams, beam 1 input and beam 2 input, that are applied to the module, are coupled to the coordinate conversion blocks 8-1a and 8-1b, respectively. The coordinate conversion blocks transform the inputs into a phase $P_1$ and $P_2$ and magnitude $M_1$ and $M_2$ components. The phase components $P_1$ and $P_2$ are delayed by delay blocks 11-5a and 11-5b, respectively. The delay blocks 11-5a, 11-5b account for the processing latency of the Single-beam CFR module 11-1 and the Magnitude distributor module 11-2, such that the delayed phases $P_1$, $P_2$, and the CFR'ed magnitudes $M_1$, $M_2$ arrive at the Coordinate conversion modules 8-1c, 8-1d, respectively, at synchronized time instances. These magnitudes are then scaled in the multipliers 8-3a and 8-3b by a weight function $W_1$ and $W_2$, respectively. An adder 8-4 adds the two resulting magnitudes and delivers the resultant output to a single beam CFR 11-1. In the Multi-Beam peak detector, a weighted sum of beam signal magnitudes is compared to a given threshold.

The single beam CFR block 11-1 can be replaced with an alternative known peak reduction method, e.g., hard clipping (HC), iterative clipping and filtering (ICF), and peak cancellation (PC). The output of the single beam CFR block 11-1 is coupled as an input to the magnitude distributor block 11-2. The magnitude distributor block 11-2 generates the separate magnitude waveforms at output nodes 11-3a and 11-3b. The waveforms at these outputs are varied proportionally to the amplitudes of the values of the original input beam 1 and beam 2. It is assumed, though not shown in the figure, that $W_1$, $W_2$ are known to the modules. The coordinate conversion block 8-1c combines the phase $P_1$ and CFR'ed magnitude $M_1$ associated with beam 1 to generate the beam 1 output. The coordinate conversion block 8-1d combines the phase $P_2$ and CFR'ed magnitude $M_2$ associated with beam 2 to generate the beam 2 output.

In FIG. 11A, the Magnitude Distributor of this described embodiment distributes the CFR'ed sum magnitude proportionally to each of the beams, similar to what was described earlier. Let $M_1$, $M_2$, respectively, be the original magnitudes of Beams 1, 2, and C be the output of the traditional single-beam CFR module. The modified magnitudes for Beams 1, 2 are then be given by:

$$M_1' = M_1 C / (W_1 M_1 + W_2 M_2) \quad \text{(EQU. 9)}$$

$$M_2' = M_2 C / (W_1 M_1 + W_2 M_2) \quad \text{(EQU. 10)}$$

(Again note that M1, M2, and W1M1+W2M2 need to be supplied as inputs to magnitude distributor 11-2, though this is not explicitly shown in the figure.)

As another example, consider employing the Small Signal Protection method with protection levels $L_1$, $L_2$. In this case, the modified magnitudes are:

$$M_1' = \frac{M_1 C'}{W_1 M_1 + W_2 M_2} + Z_1 \quad \text{(EQU. 11)}$$

$$M_2' = \frac{M_2 C'}{W_1 M_1 + W_2 M_2} + Z_2 \quad \text{(EQU. 12)}$$

where $$Z_1 \triangleq \min(M_1, L_1), Z_2 \triangleq \min(M_2, L_2), C' \triangleq C - Z_1 - Z_2 \quad \text{(EQU. 13)}$$

Figure 11B:
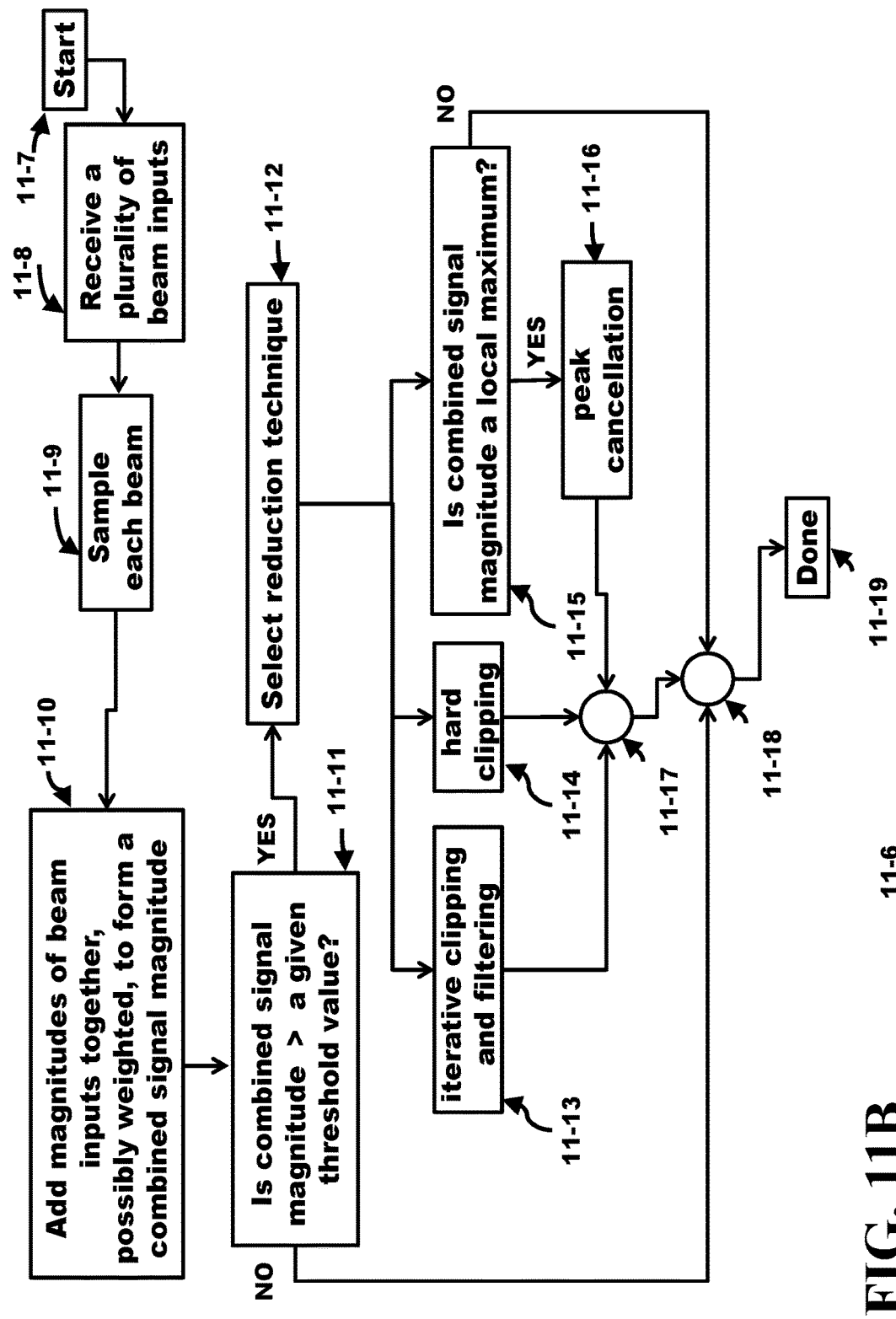
FIG. 11B is a flowchart depicting one iteration of processing a sample from a plurality of beams.

FIG. 11B shows a flowchart 11-6 depicting one iteration of processing samples concurrently selected from each of a plurality of beam inputs of a phased array. This flowchart represents a simplified sub-set flow of the overall process flow for a Multi-Beam CFR process. The embodiment illustrated presents how samples from the plurality of beam inputs are processed to reduce the PAPR. At start 11-7, a plurality of beam inputs that will be transmitted from the phased array are received 11-8. The magnitude of each one of the plurality of beams is sampled 11-9.

The described embodiment operates in the digital domain. Typically, the transmit signal is generated in the base station and is already in the digital domain at signal generation. The sampling frequency is specified in the communications standards, e.g., the LTE standards, and the sampling frequency will be greater than the Nyquist frequency to ensure the corresponding analog signal can be faithfully reproduced.

These sampled magnitudes, possibly weighted by weights not equal to one, are summed together to form a combined signal magnitude 11-10. A decision block 11-11 is configured to determine if the combined signal magnitude is greater than a given threshold value. If the combined signal magnitude is less than the given threshold, the flow proceeds through collector 11-18 to done 11-19. However, if the combined signal magnitude is greater than the given threshold, a reduction technique 11-12 is selected from at least three different reduction methods: iterative clipping and filtering 11-13, hard clipping 11-14, or peak cancellation 11-16. Typically, the selection is made in advance during the design process. Once a technique is chosen, it is implemented and the chosen technique is applied to all samples. The criteria for choosing different techniques are: implementation complexity, processing latency, and peak reduction performance. Alternatively, the selection can be done in real time depending on which technique is most suitable for the conditions of the environment at the time.

The iterative clipping and filtering 11-13 clips the plurality of beam inputs in proportion to the amount that the combined signal magnitude is in excess of the given threshold value and then filters the signal. The hard clipping 11-14 just clips the plurality of beam inputs in proportion to the amount that the combined signal magnitude is in excess of the given threshold value. For the peak cancellation 11-16 method, a decision block 11-15 is configured to determine if the sample is a local maximum. If the sample is not a local maximum, the flow moves to collector 11-18 and the process is done 11-19. Otherwise, the peak cancellation 11-16 method applies a pre-recorded peak cancellation pulse (PCP) to at least the current sample to reduce the value of this sample. The collector 11-17 routes the results of the one selected technique from the three selected methods to collector 11-18. The flow continues through collector 11-18 to done 11-19 completing one iteration of the CFR process.

Figure 12:
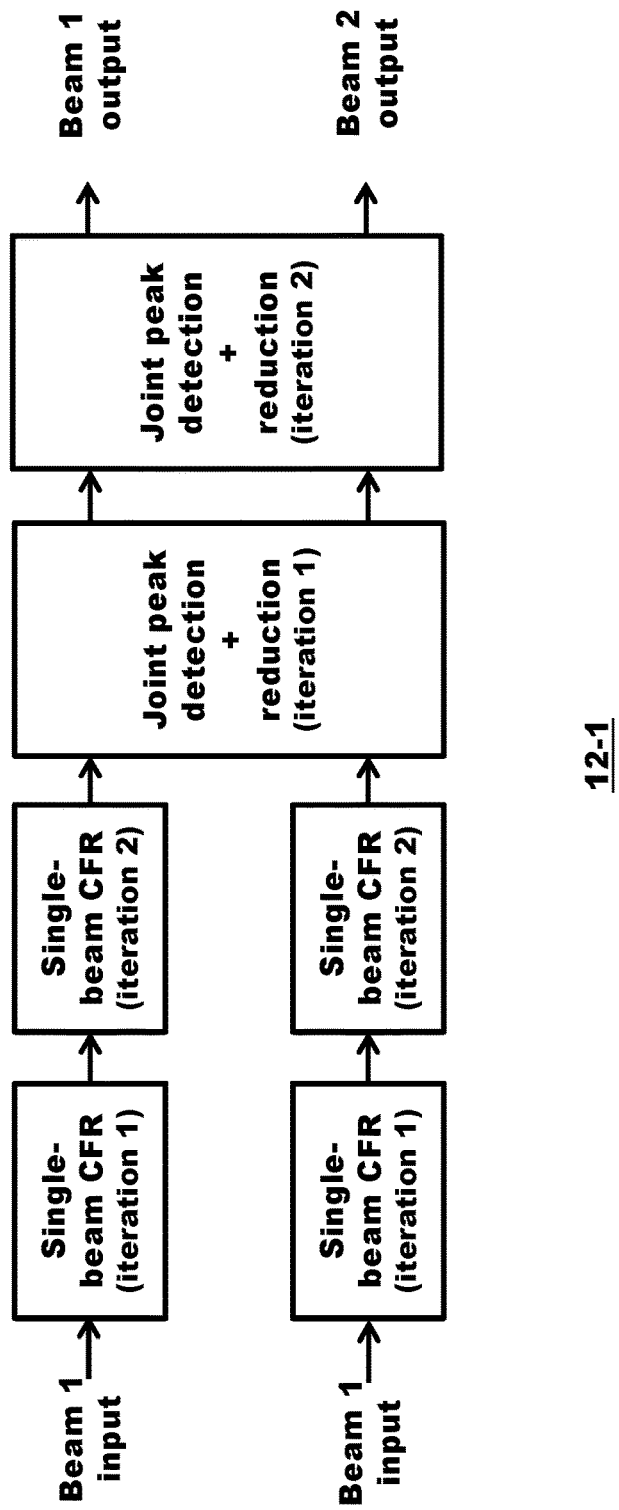
FIG. 12 is a block diagram of an embodiment involving multiple single beam iterations followed by multiple Multi-Beam CFR iterations.
Figure 14:
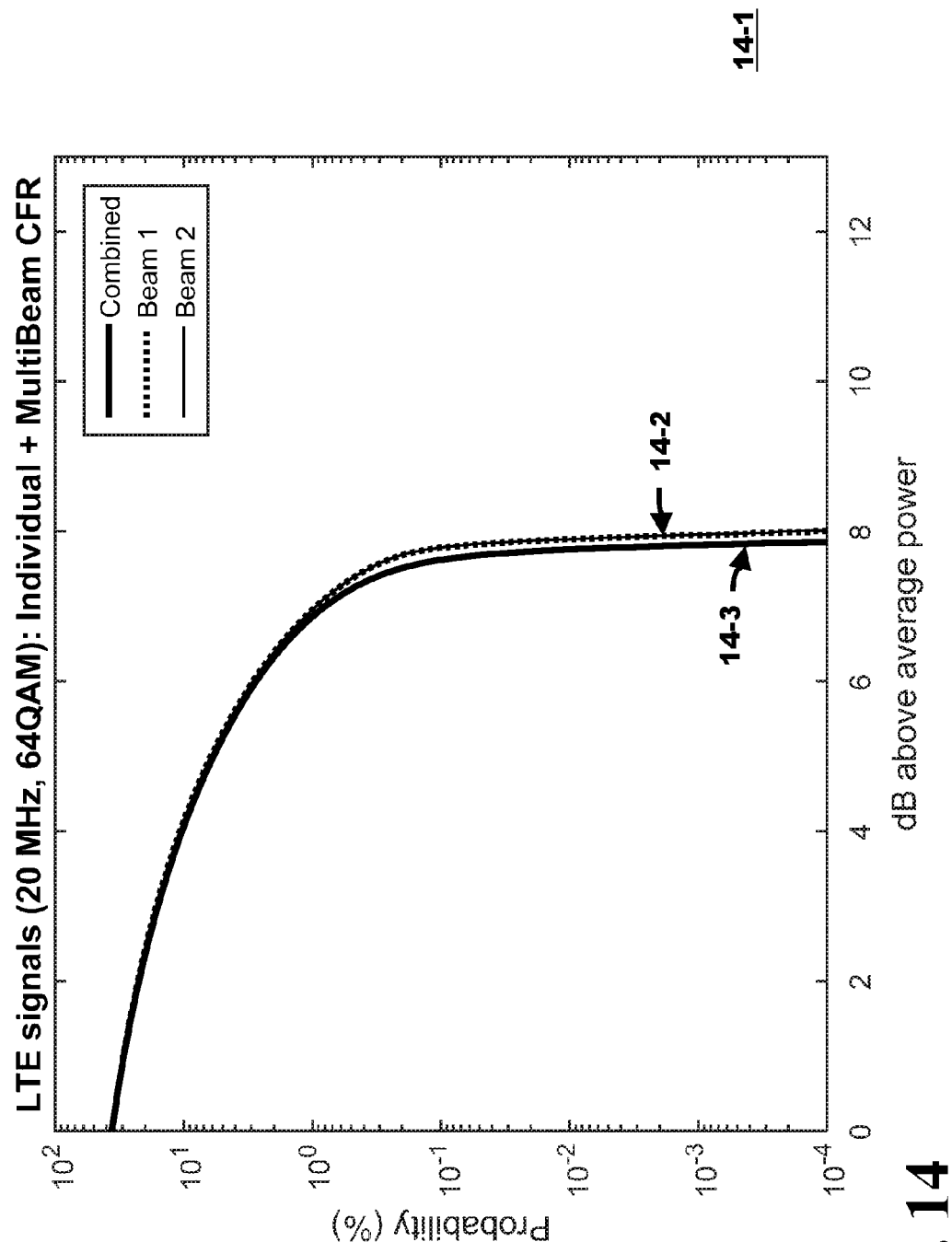
FIG. 14 shows the performance results of Multi-Beam CFR with individual CFR using standard test waveforms.

FIG. 12 presents a block diagram 12-1 of a module that employs two iterations of traditional single-beam CFR modules prepended to the two iterations of joint peak detection and reduction block. Single-beam CFR modules are prepended to Multi-Beam CFR modules to make both the combined PAPR and the individual PAPRs to meet their respective design targets, as illustrated in FIG. 14. Multiple iterations of single-beam or Multi-Beam CFR are used to ensure most peaks are reduced (a single iteration may only reduce a portion of the peaks due to limited hardware processing capability), or to achieve better performance in terms of peak reduction vs. signal distortion. The number of iterations of single-beam or Multi-Beam CFR is typically decided a priori, based on simulations on off-line test signals. Typically, the number of such iterations ranges from two to four. In FIG. 12, two iterations of single-beam CFR and two iterations of Multi-Beam CFR were shown simply as an example. The number of iterations may vary in other designs.

In general, the individual CFR stages may either have different thresholds or identical thresholds for each of the iterations. Similarly, the Multi-Beam CFR blocks may either have different thresholds or identical thresholds for each of the iterations. Furthermore, either one of the method of hard clipping (HC), iterative clipping and filtering (ICF), or peak cancellation (PC) can be used in the single beam CFR blocks and the Joint peak detection and reduction block.

Figure 13:
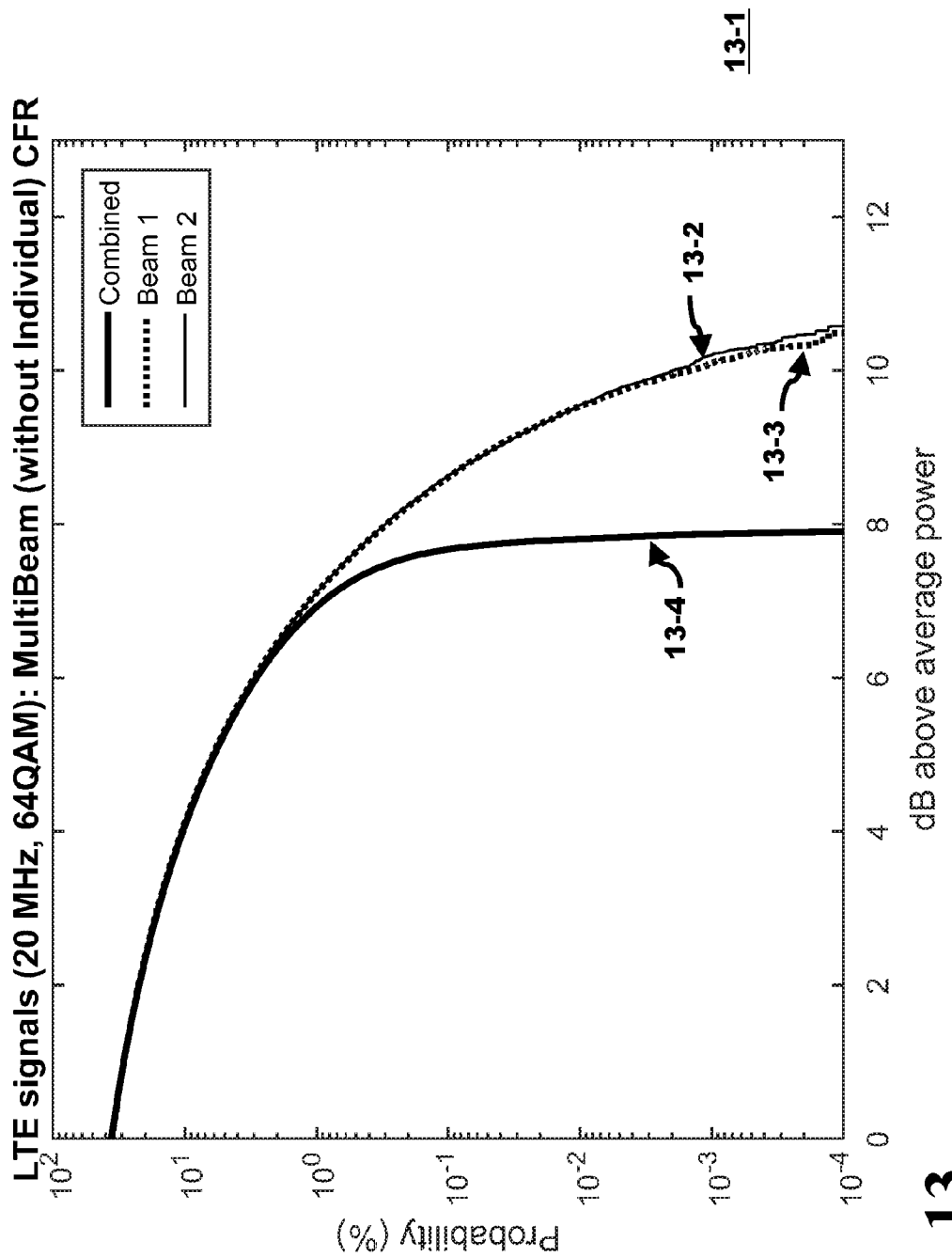
FIG. 13 illustrates the performance results of Multi-Beam CFR without individual CFR using standard test waveforms.

FIG. 13 presents a graph 13-1 that displays the probability of signal peaks in LTE signal using 4 iterations of the Joint peak detection and reduction block evaluated in a 20-MHz LTE downlink channel with two beams, using the standard E-TM3.1 (64QAM) test waveform. Multi-Beam CFR with Iterative Clipping and Filtering was used. Referring to FIG. 13, the graphical results correspond to using the four Joint peak detection and reduction blocks connected in series while the single beam CFR blocks were eliminated from the path. The combined PAPR 13-4 is 8 dB above average power. However, since the single beam CFR blocks were not used, the individual PAPR 13-2 and 13-3 for the individual beams are about 10.5 dB above average power or about 2.5 dB higher than the joint result. Note that the combined PAPR meets the 8-dB design target. However, since the Individual CFR blocks where not used, the individual PAPRs failed to meet the 8-dB design target.

FIG. 14 presents a graph 14-1 that displays the probability of signal peaks in an LTE signal using four iterations of the single beam CFR block followed by four iterations of the joint peak detection and reduction block evaluated in a 20-MHz LTE downlink channel with two beams, using the standard E-TM3.1 (64QAM) test waveform. Referring to FIG. 12, the graphical results corresponds to the results for the case of four sets of single beam CFR blocks connected in series to four joint peak detection and reduction block connected in series. The combined PAPR 14-3 is less than 8 dB above average power, while the individual PAPR are about 8 dB above average power. The combined (Individual+) Multi-Beam CFR systems where each of the individual and Multi-Beam are iterated four times reduces the PAPR of all results to approximately 8 dB. Note that when the Individual CFR blocks were used in conjunction with the Multi-Beam CFR blocks, all the combined PAPR and the individual PAPRs meet the 8-dB design target.

Figure 15:
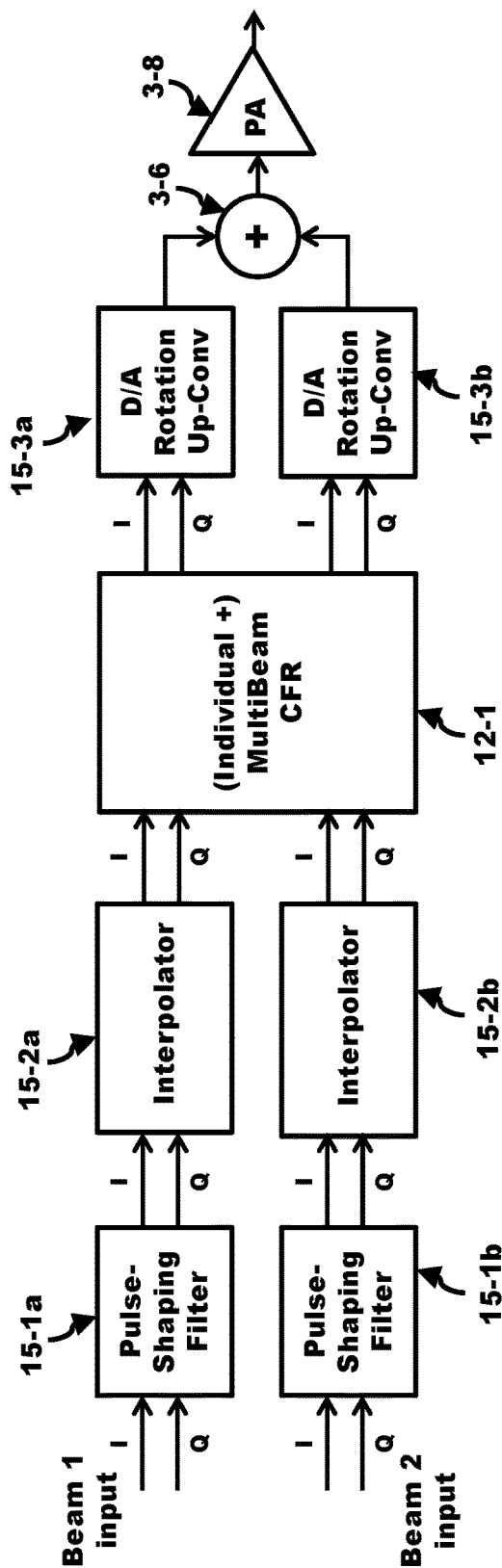
FIG. 15 is a block diagram of an embodiment employing Multi-Beam CFR (with or without individual CFR) embedded within a transmit chain.

The (Individual+) Multi-Beam CFR system 12-1 can be integrated into a typical DFE (Digital Front End) architecture as depicted in the embodiment of FIG. 15. The RF digital front end (DFE) system shows that the (Individual+) Multi-Beam CFR system 12-1 are applied after the transmit pulse-shaping filters 15-1a and 15-1b and the interpolators 15-2a and 15-2b but before the digital-to-analog converter (D/A), phase rotation, and up-conversion blocks 15-3a and 15-3b. The pulse-shaping filters are used to remove excessive spectral components of the transmit signal to make the signal bandwidth stay within the channel bandwidth. The interpolators are used to increase the sampling rate of the transmit signal. The higher sampling rate aids the digital-to-analog conversion process.

Alternative configurations of (Individual+) Multi-Beam CFR system 12-1 could include one or more joint peak detection and reduction blocks and/or one or more single beam CFR blocks followed by one or more joint peak detection and reduction block. The beam inputs are coupled to the pulse-shaping filters 15-1a and 15-1b. The signals from the pulse shaping filters are coupled into the interpolators 15-2a and 15-2b, the outputs of which are delivered to the (Individual+) Multi-Beam CFR system. The output signals from the (Individual+) Multi-Beam CFR system are D/A converted, rotated and scaled, and then up converted 15-3a and 15-3b before being delivered to an adder 3-6. In the last transmitter processing step, the different beam signals are summed together before going through the power amplifier 3-8.

Figure 16A:
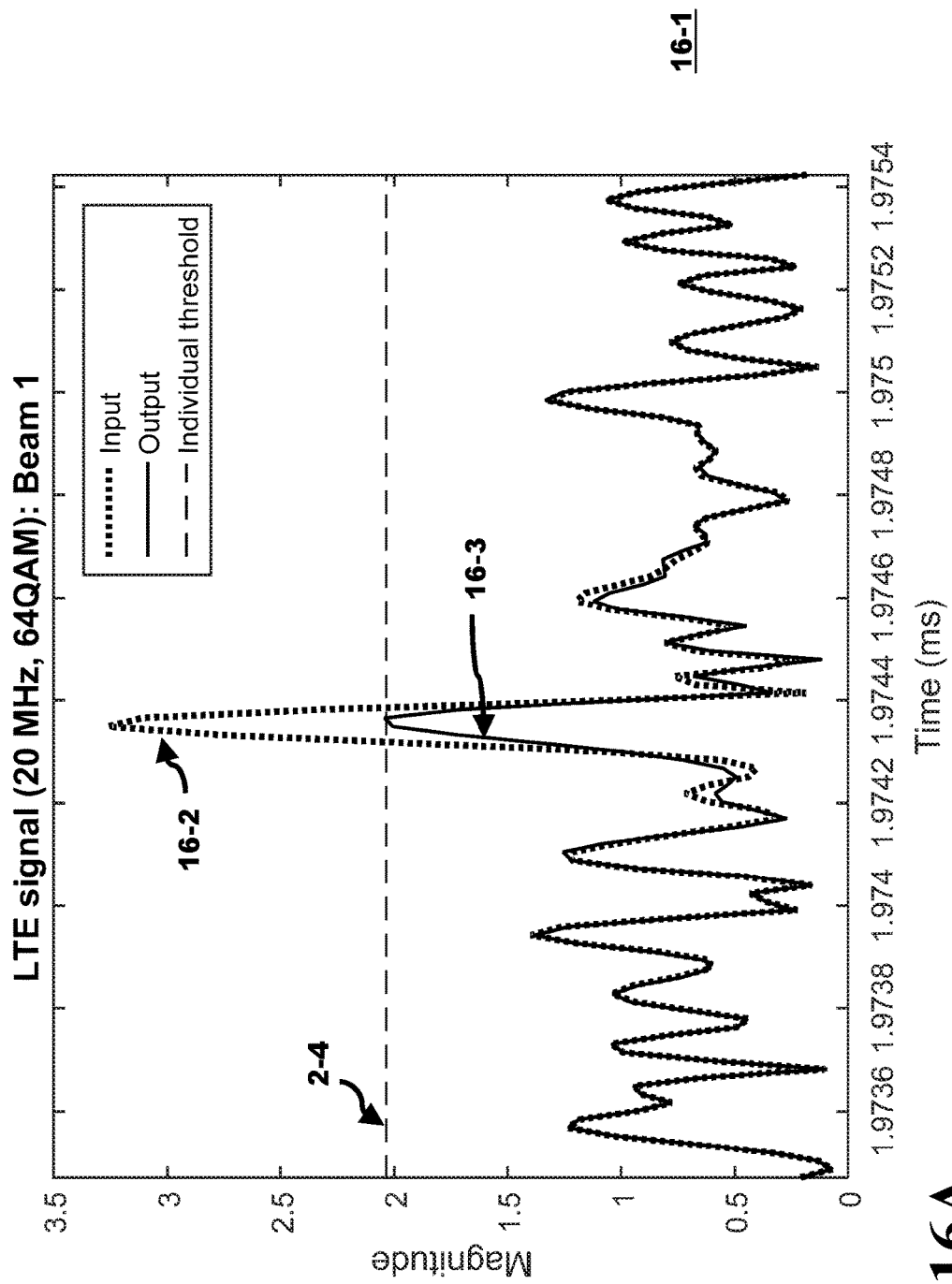
FIG. 16A shows the input/output results of a first beam using two iterations of individual and Multi-Beam CFR.

FIG. 16A depicts a time domain plot 16-1 that displays the waveform 16-2 of the first beam input signal and the output waveform 16-3 of a LTE signal for the system depicted in FIG. 12 that includes two iterations of the single beam CFR blocks followed by two iterations of the joint peak detection and reduction block. The results are evaluated in a 20-MHz LTE downlink channel with two beams, using the standard E-TM3.1 (64QAM) test waveform. The output waveform 16-3 just matches the individual given threshold 2-4. Note that the Beam 1 input signal magnitude is above the threshold and that its corresponding output signal magnitude 16-3 is below the threshold after processing.

Figure 16B:
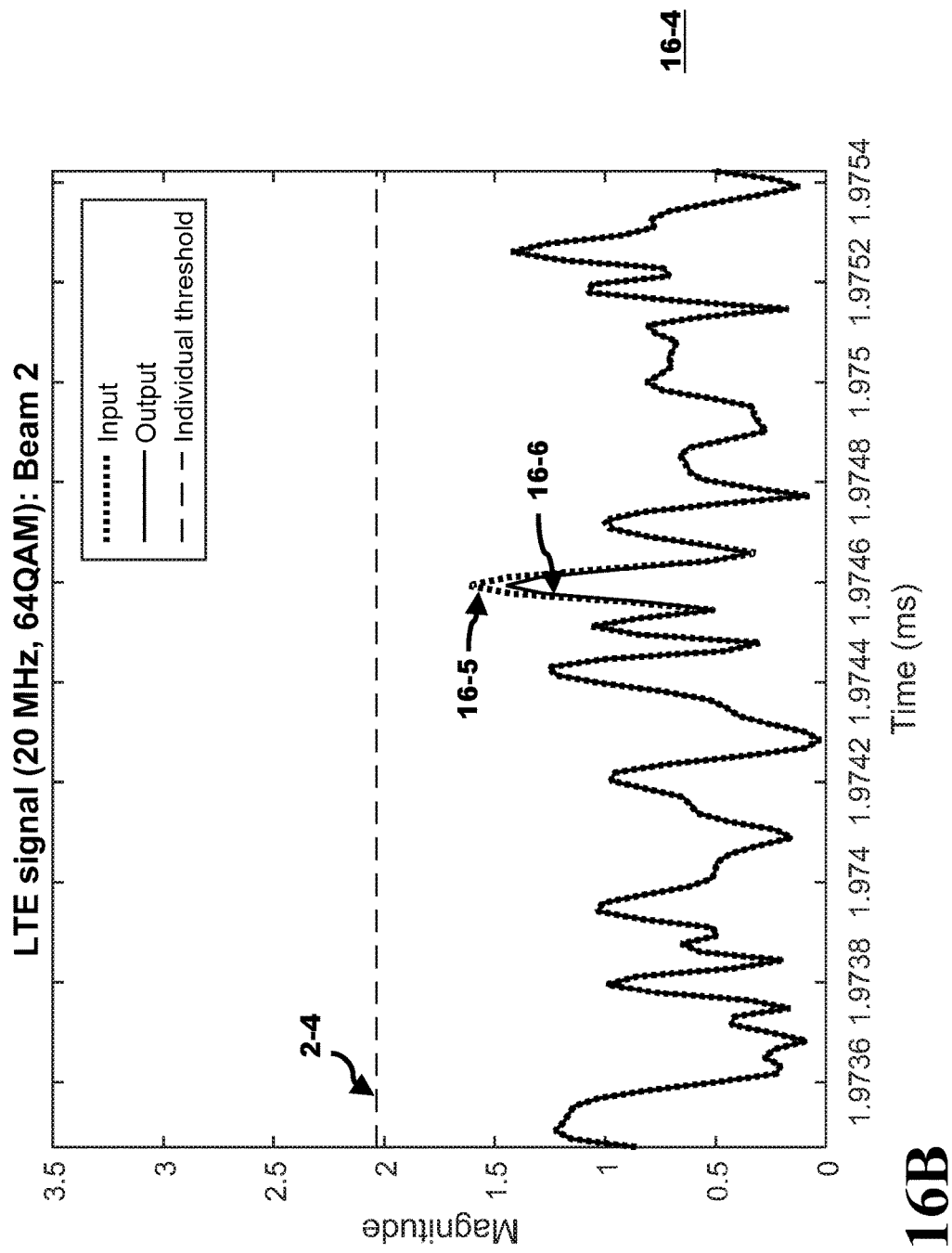
FIG. 16B illustrates the input/output results of a second beam using two iterations of individual and Multi-Beam CFR.

FIG. 16B depicts a time domain plot 16-4 that displays the waveform 16-5 of the second beam and the output waveform 16-6 of a LTE signal for the system of FIG. 12 that includes two iterations of the single beam CFR blocks followed by two iterations of the joint peak detection and reduction block. The results are evaluated in a 20-MHz LTE downlink channel with two beams, using the standard E-TM3.1 (64QAM) test waveform. The output waveform 16-6 is below the individual given threshold 2-4. Note that the Beam 2 input signal magnitude is below the threshold to begin with and its corresponding output signal magnitude is still below the threshold after processing.

Figure 16C:
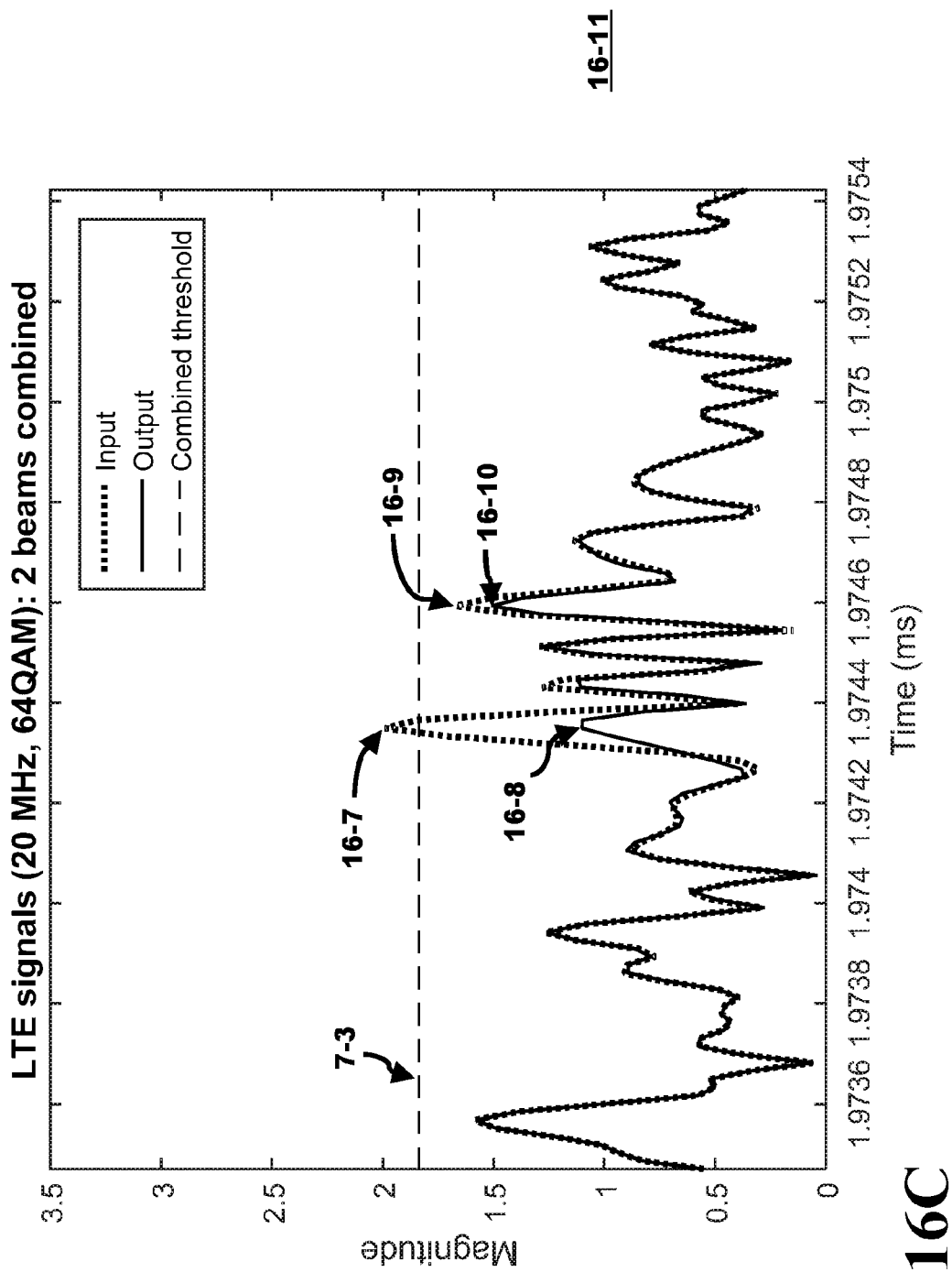
FIG. 16C illustrates the combined first and second beams using two iterations of individual and Multi-Beam CFR.

FIG. 16C depicts a time domain plot 16-11 that displays the combined waveforms of the two beams (dotted) and the output waveform (solid) of a LTE signal for the system of FIG. 12 that includes two iterations of the single beam CFR blocks followed by two iterations of the joint peak detection and reduction block. The results are evaluated in a 20-MHz LTE downlink channel with two combined beams, using the standard E-TM3.1 (64QAM) test waveform. The peaks 16-8 and 16-10 of the output waveform are below the combined threshold 7-3. Note that the combined beam input signal magnitude is above the threshold and its corresponding output signal magnitude is below the threshold after processing.

The performance of the Individual+Multi-Beam PC-CFR method is evaluated in a 20-MHz LTE downlink channel with two beams, using the standard E-TM3.1 (64QAM), E-TM3.2 (16QAM), and E-TM3.3 (QPSK) test waveforms. ACLR and EVM are measured according to the LTE standards, and PAPR is measured at 0.0001%. The results are summarized in the table presented in FIG. 17. The evaluation is based on a MATLAB floating-point model, and the ±values correspond to the standard deviations over 100 pairs of independent 10-ms test signals. The ACLR target is designed to be above 70 dBc, and the individual and desired PAPR targets are both set as 8 dB. For the combined signals, a phased array application is assumed, and the PAPR statistics is taken over 24 antenna elements. At each element, uniformly random phase rotations are applied to the two beam signals followed by summation. In all cases, it is observed that the resultant EVM is below half of the corresponding LTE EVM limit provided in the standards.

A hardware realization of the Individual+Multi-Beam PC-CFR method has been implemented using VHDL with 16-bit fixed-point targeting a mid-range FPGA device. The VHDL RTL simulation results match closely with the MATLAB floating-point model. The implemented hardware module has latency of 6.2 μs, and the FPGA utilization consumes approximately 10% of the device resources.

The systems and methods of the joint peak detection and reduction block disclosed herein can be implemented on general or special purpose computers or other programmable hardware devices programmed through software, or as hardware or equipment "programmed" through hard wiring, or a combination of the two. Some examples of hardware include, but are not limited to: an FPGA, a full custom designed chip, a DSP, an embedded processor, etc. A computer-readable medium can be encoded with a computer program, so that execution of that program by one or more processors perform one or more of the methods of joint peak detection and reduction.

The algorithm for the joint peak detection and reduction method (i.e., the Multi-Beam CFR method) disclosed herein can be implemented as general or special purpose computer or other programmable hardware devices programmed through software, or as hardware or equipment "programmed" through hard wiring, or a combination of the two. A "computer" (e.g., an online access device) can comprise a single machine or processor or can comprise multiple interacting machines or processors (located at a single location or at multiple locations remote from one another).

A computer-readable medium can be encoded with a computer program implementing the Multi-Beam CFR algorithm, so that execution of the Multi-Beam CFR program by one or more computers causes the one or more computers to perform one or more of the methods disclosed herein. Suitable media can include temporary or permanent storage or replaceable media, such as network-based or Internet-based or otherwise distributed storage of software modules that operate together hard drives, thumb drives, flash memory, optical media, magnetic media, semiconductor media, or any future storage alternatives. Such media can also be used for databases recording the information described above. These computer programs (also known as programs, software, software applications or code) include machine instructions for a programmable processor, and can be implemented in a high-level procedural and/or object-oriented programming language, and/or in assembly/machine language.

While the embodiments of the Multi-Beam CFR method and apparatus have been described by combining either two or three beam inputs, those of skill in the art will recognize that the present disclosure can be used to combine any plurality of beam inputs using the same described principles, if desired. In general, the data path for a given beam to a given power amplifier may go through a variable gain in addition to a phase rotation. The variable gain does not affect the quality of the rotational invariance. A variable gain that is applied to one of the signals causes the same gain to be applied to the peak power as well as applying the same gain to the average power of that one signal. Therefore, the desired PAPR, after experiencing a variable gain, remains a constant independent of the magnitude of the variable gain. Also, the up-conversion operation (converting a baseband signal to a radio frequency signal) may take place before or after phase rotation. Furthermore, a computer-readable medium can be encoded with a computer program, so that execution of that program by one or more processors to perform one or more of the methods of phase and amplitude adjustment. In accordance with these principles, those skilled in the art can devise numerous modifications without departing from the spirit and scope of the invention. For example, a network and a portable system can exchange information wirelessly by using communication techniques such as Time Division Multiple Access (TDMA), Frequency Division Multiple Access (FDMA), Code Division Multiple Access (CDMA), Orthogonal Frequency Division Multiplexing (OFDM), Ultra Wide Band (UWB), Wi-Fi, WiGig, Bluetooth, etc. The communication network can comprise the phone network, IP (Internet protocol) network, Local Area Network (LAN), ad hoc networks, local routers and even other portable systems. A "computer" can comprise a single machine or processor or can comprise multiple interacting machines or processors (located at a single location or at multiple locations remote from one another).

What is claimed is:

1. A system for use with a plurality of beam signals, said system comprising:
    a crest factor reduction (CFR) circuit having a plurality of inputs and a corresponding plurality of outputs, wherein each of the inputs of the plurality of inputs is for receiving a corresponding different beam signal of the plurality of beam signals and wherein each output of the plurality of outputs corresponds to a different input of the plurality of inputs and is for outputting a different CFR-adjusted signal of a plurality of CFR-adjusted signals, each CFR-adjusted signal of the plurality of CFR-adjusted signals corresponding to a different beam signal of the plurality of beam signals;
    wherein the CFR circuit is configured to perform crest factor reduction on the plurality of beam signals to generate the plurality of CFR-adjusted signals, and wherein the crest factor reduction performed on the plurality of beam signals is based on a weighted sum of the magnitudes of multiple beam signals among the plurality of beam signals, wherein the weighted sum of the magnitudes of multiple beam signals employs weights that are not all equal.

2. The system of claim 1, wherein the CFR circuit is configured to use the weighted sum of the magnitudes of multiple beam signals among the plurality of beam signals to determine when to reduce the magnitudes of the beam signals of the plurality of beams signals.

3. The system of claim 2, further comprising a transmitter connected to the plurality of outputs of the CFR circuit, the transmitter comprising:
    a plurality of up-conversion modules, each electrically coupled to a corresponding different one of the outputs of the plurality of outputs of the CFR module and for up-converting a signal derived from the CFR-adjusted signal for that output;
    a combiner for combining signals from the plurality of up-conversion modules and generating a combined signal; and
    a power amplifier electrically coupled to the output of the combiner.

4. The system of claim 3, wherein the power amplifier has an output and the system further comprises an antenna electrically connected to the output of the power amplifier.

5. The system of claim 2, wherein the crest factor reduction performed on the plurality of beam signals is based on a weighted sum of the magnitudes of all of the beam signals among the plurality of beam signals.

6. The system of claim 5, wherein the CFR circuit further comprises a peak detector for detecting when the weighted sum of the magnitudes of all of the beam signals of the plurality of beam signals exceeds a predetermined threshold.

7. The system of claim 5, wherein the crest factor reduction that the CFR circuit is configured to perform involves hard clipping.

8. The system of claim 2, wherein the weighted sum of the magnitudes of multiple beam signals among the plurality of beam signals is a sum of the magnitudes of all of the beam signals among the plurality of beam signals.

9. The system of claim 2, wherein the CFR circuit comprises a plurality of coordinate conversion modules, and wherein each coordinate conversion module of the plurality of coordinate conversion modules is coupled to a different corresponding input of the plurality of inputs and is for determining a magnitude of the beam signal received over that input.

10. The system of claim 9, wherein the CFR circuit further comprises a plurality of multipliers, each multiplier of the plurality of multipliers coupled to a corresponding different coordinate conversion module.

11. The system of claim 9, wherein the CFR circuit further comprises an adder for adding signals derived from each of the coordinate conversion modules of the plurality of coordinate conversion modules to generate the weighted sum of the magnitudes of all of multiple beam signals among the plurality of beam signals.

12. The system of claim 2, wherein the crest factor reduction that the CFR circuit is configured to perform involves peak cancellation.

13. The system of claim 2, wherein the crest factor reduction that the CFR circuit is configured to perform involves iterative clipping.

14. A method for processing a plurality of beam signals, said method comprising:
    determining a magnitude of each beam signal of the plurality of beam signals;
    computing a weighted sum of the magnitudes of the plurality of beam signals, wherein the weighted sum of the magnitudes of the plurality of beam signals employs weights that are not all equal; and
    performing crest factor reduction on the plurality of beam signals to generate a corresponding plurality of CFR-adjusted signals, wherein performing crest factor reduction on the plurality of beam signals is based on the computed weighted sum of the magnitudes of the plurality of beam signals.

15. The method of claim 14, further comprising:
    processing the plurality of CFR-adjusted signals to generate a plurality of processed signals; and
    combining the plurality of processed signals to generate a combined transmit signal.

16. The method of claim 15, further comprising delivering the combined transmit signal to an antenna for wireless transmission.

17. The method of claim 14, wherein performing crest factor reduction comprises using the weighted sum of the magnitudes to determine when to reduce the magnitudes of any of the beam signals of the plurality of beam signals.

18. The method of claim 14, wherein performing crest factor reduction on the plurality of beam signals comprises detecting when the weighted sum of the magnitudes of all of the beam signals of the plurality of beam signals exceeds a predetermined threshold.

19. The method of claim 14, wherein performing crest factor reduction on the plurality of beam signals comprises hard clipping.

20. The method of claim 14, wherein performing crest factor reduction on the plurality of beam signals comprises peak cancellation.

21. The method of claim 14, wherein performing crest factor reduction on the plurality of beam signals comprises iterative clipping.

* * * * *